United States Patent
Kwon et al.

(10) Patent No.: US 11,670,636 B2
(45) Date of Patent: Jun. 6, 2023

(54) METHOD FOR FABRICATING SEMICONDUCTOR DEVICE

(71) Applicant: SAMSUNG ELECTRONICS CO., LTD., Suwon-si (KR)

(72) Inventors: Tae Yong Kwon, Suwon-si (KR); Byoung-Gi Kim, Suwon-si (KR); Ki Hwan Lee, Suwon-si (KR); Jung Han Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/577,549

(22) Filed: Jan. 18, 2022

(65) Prior Publication Data

US 2022/0139912 A1  May 5, 2022

Related U.S. Application Data

(63) Continuation of application No. 16/735,984, filed on Jan. 7, 2020, now Pat. No. 11,282,835.

(30) Foreign Application Priority Data

May 16, 2019 (KR) .................. 10-2019-0057279

(51) Int. Cl.
*H01L 27/088* (2006.01)
*H01L 21/8234* (2006.01)
*H01L 29/66* (2006.01)
*H01L 29/78* (2006.01)

(52) U.S. Cl.
CPC .. *H01L 27/0886* (2013.01); *H01L 21/823431* (2013.01); *H01L 29/6681* (2013.01); *H01L 29/7851* (2013.01)

(58) Field of Classification Search
CPC ......... H01L 27/0886; H01L 21/823431; H01L 29/6681; H01L 29/7851
See application file for complete search history.

(56) References Cited

U.S. PATENT DOCUMENTS

| | | | |
|---|---|---|---|
| 9,034,723 B1 | 5/2015 | Shieh et al. | |
| 9,171,764 B2 | 10/2015 | Kim et al. | |
| 9,209,038 B2 | 12/2015 | Cantone et al. | |
| 9,449,880 B1 | 9/2016 | Tseng et al. | |
| 9,564,446 B1* | 2/2017 | Weybright | H01L 21/0273 |
| 9,679,815 B2 | 6/2017 | Lee et al. | |
| 9,786,502 B2 | 10/2017 | Li et al. | |
| 10,014,297 B1* | 7/2018 | Sun | H01L 27/0886 |

(Continued)

*Primary Examiner* — Christine A Enad
(74) *Attorney, Agent, or Firm* — Lee IP Law, P.C.

(57) ABSTRACT

A semiconductor device includes a substrate having first and second regions, first fin groups spaced along a first direction on the first region, each of the first fin groups including adjacent first and second fins having longitudinal directions in a second direction intersecting the first direction, and third to fifth fins spaced along a third direction on the second region, the third to fifth fins having longitudinal directions in a fourth direction intersecting the third direction. The third through fifth fins are at a first pitch, the first and second fins are at a second pitch equal to or smaller than the first pitch, each of the first fin groups is at a first group pitch greater than three times the first pitch and smaller than four times the first pitch, and a width of the first and second fins is same as width of the third fin.

20 Claims, 20 Drawing Sheets

(56) References Cited

U.S. PATENT DOCUMENTS

| | | |
|---|---|---|
| 10,141,431 B1 | 11/2018 | Hung et al. |
| 11,282,835 B2* | 3/2022 | Kwon ............. H01L 21/823431 |
| 2016/0254191 A1* | 9/2016 | Tseng ................. H01L 21/3086 |
| | | 438/702 |
| 2016/0314983 A1 | 10/2016 | Han et al. |
| 2017/0170272 A1 | 6/2017 | Brink et al. |
| 2017/0358497 A1 | 12/2017 | Cheng et al. |
| 2018/0082906 A1 | 3/2018 | Song et al. |
| 2018/0330994 A1 | 11/2018 | Zang et al. |
| 2019/0067112 A1 | 2/2019 | Liang et al. |
| 2019/0287967 A1 | 9/2019 | Liaw |
| 2020/0328085 A1* | 10/2020 | Wang ............. H01L 21/823418 |
| 2020/0373161 A1* | 11/2020 | Wang ................. H01L 21/0335 |

* cited by examiner

METHOD FOR FABRICATING SEMICONDUCTOR DEVICE

CROSS-REFERENCE TO RELATED APPLICATION

This is a continuation of U.S. patent application Ser. No. 16/735,984 filed Jan. 7, 2020, which is incorporated by reference herein in its entirety.

Korean Patent Application No. 10-2019-0057279, filed on May 16, 2019, in the Korean Intellectual Property Office, and entitled: "Semiconductor Device and Method for Fabricating the Same," is incorporated by reference herein in its entirety.

BACKGROUND

1. Field

The present disclosure relates to a semiconductor device and a method for fabricating the same. More specifically, the present disclosure relates to a semiconductor device with improved operation performance and a method for fabricating the same.

2. Description of the Related Art

As one of scaling techniques for increasing density of the semiconductor device, a multi gate transistor, in which a silicon body having the shape of a fin or a nanowire is formed on a substrate and a gate is formed on a surface of the silicon body, has been proposed. Since such a multi gate transistor utilizes a three-dimensional channel, it is easily scaled. Also, even if a gate length of the multi gate transistor is not increased, the current control capability may be improved. Furthermore, it is possible to effectively suppress a short channel effect (SCE) in which potential of a channel region is affected by a drain voltage.

SUMMARY

According to an aspect of the present disclosure, there is provided a semiconductor device including a substrate having a first region and a second region, a plurality of first fin groups arranged along a first direction on the first region, each of the first fin groups having first and second fins adjacent to each other and each extending in a second direction intersecting the first direction, and third to fifth fins sequentially arranged along a third direction on the second region, adjacent to each other and each extending in a fourth direction intersecting the third direction, wherein the third and fourth fins and the fourth and fifth fins are disposed at a first fin pitch, respectively, the first and second fins are disposed at a second fin pitch which is equal to or smaller than the first fin pitch, each of the first fin groups is disposed at a first group pitch which is greater than three times the first fin pitch and smaller than four times the first fin pitch, and widths of each of the first and second fins are the same as a width of the third fin.

According to an aspect of the present disclosure, there is provided a semiconductor device including a substrate having a first region and a second region, a plurality of first fin groups arranged along a first direction on the first region, each of the first fin groups having first and second fins adjacent to each other and each extending in a second direction intersecting the first direction, and a plurality of second fin groups arranged along a third direction on the second region, each of the second fin groups including third to fifth fins adjacent to each other and extending in a fourth direction intersecting the third direction, wherein the third and fourth fins and the fourth and fifth fins are disposed at a first fin pitch, respectively, each of the second fin groups is disposed at a first group pitch which is m times (here, m is a natural number of 4 or more) the first fin pitch, each of the first fin groups is disposed at a second group pitch which is greater than three times the first fin pitch and smaller than four times the first fin pitch, and a width of each of the first and second fins are the same as a width of the third fin.

According to an aspect of the present disclosure, there is provided a semiconductor device including a substrate having a first region and a second region, first to third fins arranged sequentially along a first direction on the first region, adjacent to each other and extending in a second direction intersecting the first direction, and fourth to sixth fins arranged sequentially along a third direction on the second region, adjacent to each other and extending in a fourth direction intersecting the third direction, wherein the fourth and fifth fins are disposed at a first fin pitch, the fifth and sixth fins are disposed at a second fin pitch which is n times (here, n is a natural number of 2 or more) the first fin pitch, the first and second fins are disposed at a third fin pitch which is equal to or smaller than the first fin pitch, the second and third fins are disposed at a fourth fin pitch which is greater than twice the first fin pitch and smaller than three times the first fin pitch, and a width of each of the first to third fins are the same as a width of the fourth fin.

According to an aspect of the present disclosure, there is provided a method for fabricating a semiconductor device, including forming a plurality of first mandrel patterns on a substrate, forming an upper spacer on both side walls of the first mandrel patterns, forming a lower spacer on both side walls of a pattern onto which the upper spacer is transferred, patterning the substrate using the lower spacer to form a first fin group and a first dummy fin group arranged alternately along a first direction, and removing the first dummy fin group, wherein the first fin group includes first and second fins arranged along the first direction, adjacent to each other and extending in a second direction intersecting the first direction, respectively, the first dummy fin group includes first and second dummy fins arranged along the first direction, adjacent to each other and extending in the second direction, respectively, the first and second fins are arranged at a first fin pitch, the second fin and the first dummy fin are disposed at the first fin pitch, the first and second dummy fins are disposed at a second fin pitch different from the first fin pitch, and the second dummy fin and the first fin disposed at the first fin pitch.

According to an aspect of the present disclosure, there is provided a method for fabricating a semiconductor device, including providing a substrate including a first region and a second region, forming a plurality of first mandrel patterns disposed at a first mandrel pitch on the first region of the substrate, forming a plurality of second mandrel patterns disposed at a second mandrel pitch on the second region of the substrate, the first mandrel pitch being smaller than the second mandrel pitch, and performing a self-aligned quadruple patterning (SAQP) process using the first and second mandrel patterns to form a plurality of first fin groups on the first region and form a plurality of second fin groups on the second region, wherein each of the first fin groups includes first and second fins adjacent to each other and extending side by side, each of the second fin groups includes third to fifth fins adjacent to each other and extending side by side, the third and fourth fins and the fourth and fifth fins are disposed at a first fin pitch, respectively, and the second mandrel pitch is four times the first fin pitch.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, a semiconductor device according to some embodiments will be described with reference to FIGS. 1 and 2.

Figure 1:
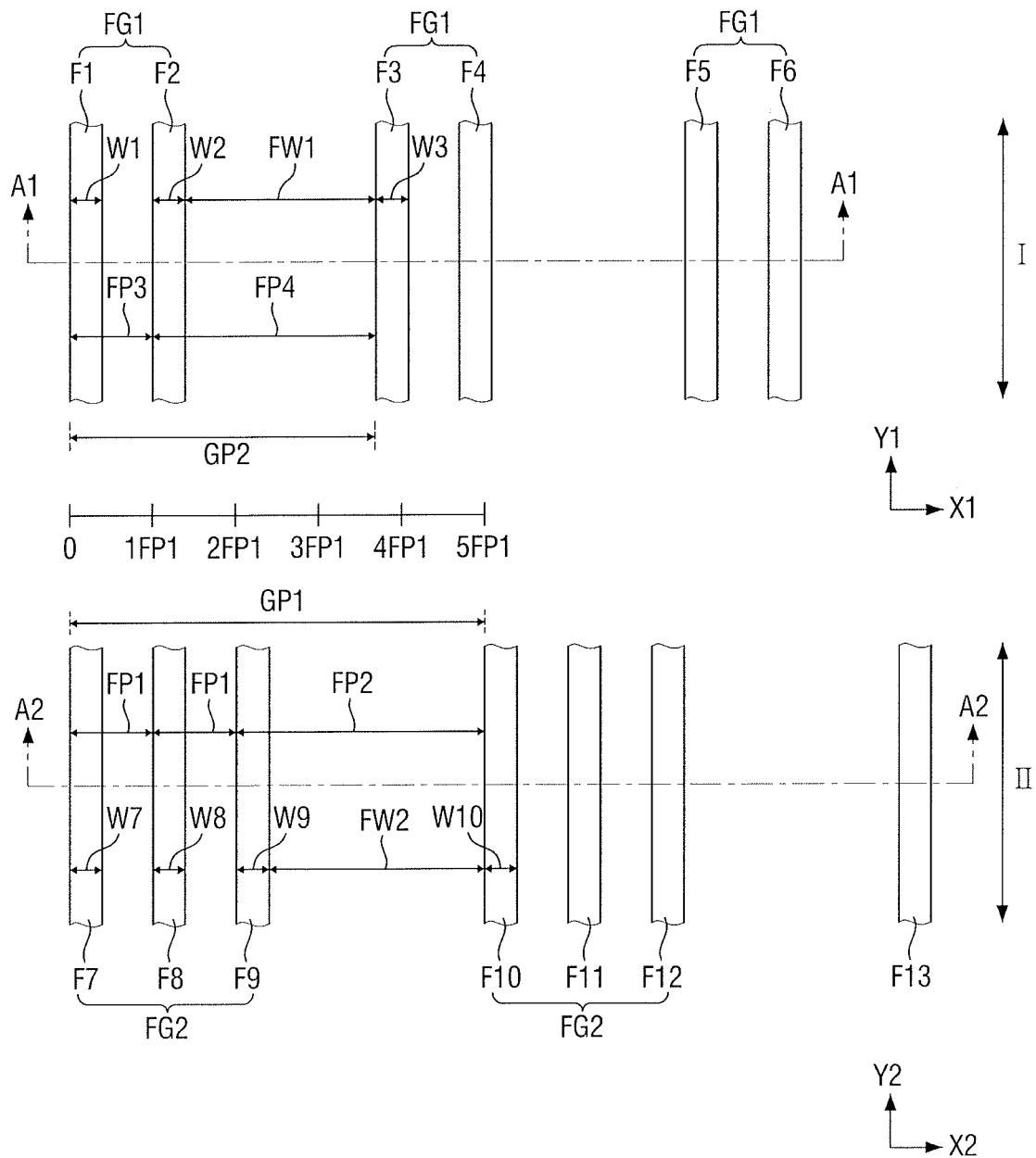
FIG. 1 illustrates a layout diagram of a semiconductor device according to some embodiments.

FIG. 1 is a layout diagram for explaining a semiconductor device according to some embodiments. FIG. 2 is a cross-sectional view along lines A1-A1 and A2-A2 of FIG. 1.

Figure 2:
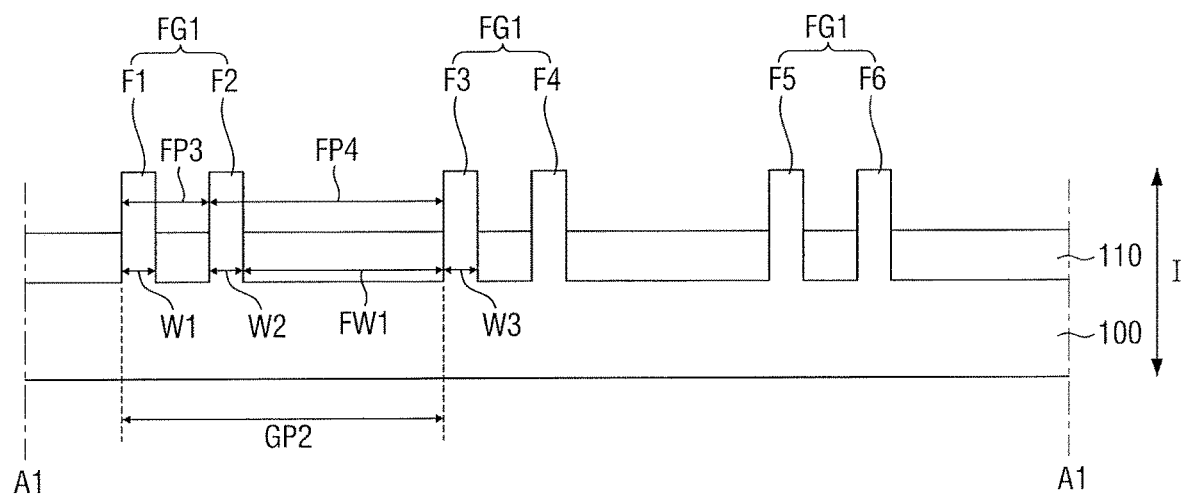
FIG. 2 illustrates a cross-sectional view along lines A1-A1 and A2-A2 of FIG. 1.
Figure 2:
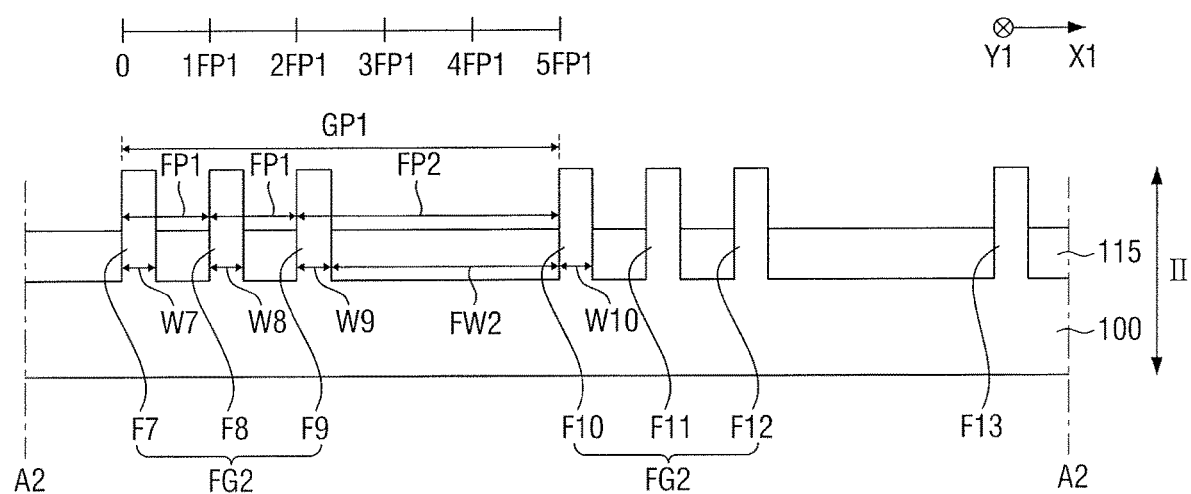

Referring to FIGS. 1 and 2, the semiconductor device according to some embodiments may include a substrate 100, a plurality of fins, e.g., a first fin F1 through a thirteenth F13, a first field insulating film 110, and a second field insulating film 115. The substrate 100 may include a first region I and a second region II, so the first and second field insulating films 110 and 115 may be positioned in the first and second regions I and II, respectively.

The substrate 100 may include, e.g., a base substrate and an epitaxial layer grown on the base substrate. For example, the substrate 100 may only include the base substrate without an epitaxial layer. For example, the substrate 100 may be a silicon substrate, a gallium arsenide substrate, a silicon germanium substrate, a ceramic substrate, a quartz substrate, a glass substrate for a display, or the like, and may be an SOI (Semiconductor On Insulator) substrate.

The substrate 100 may include the first region I and the second region II. The first region I and the second region II may be regions separated from each other or may be regions connected to each other. A portion of the plurality of fins may protrude from the substrate 100 on the first region I, while a remaining portion of the plurality of fins may protrude from the substrate on the second region II.

For example, as illustrated in FIG. 2, the plurality of fins, e.g., the first to thirteenth fins F1 to F13, may protrude upwardly from the substrate 100. Each of the plurality of fins, e.g., the first to thirteenth fins F1 to F13, may be formed by etching a part of the substrate 100 or may be an epitaxial layer grown from the substrate 100.

For example, a first portion of the plurality of fins, e.g., each of the first to sixth fins F1 to F6, may be formed on the first region I to extend side by side, and a second portion of the plurality of fins, e.g., each of the seventh to thirteenth fins F7 to F13, may be formed on the second region II to extend side by side. For example, the first to sixth fins F1 to F6 may be sequentially arranged to be spaced apart from each other along a first direction X1 and may have longitudinal directions extending in a second direction Y1 intersecting the first direction X1, respectively. Also, for example, each of the seventh to thirteenth fins F7 to F13 may be sequentially arranged to be spaced apart from each other along a third direction X2, and may have longitudinal directions extending in a fourth direction Y2 intersecting the third direction X2.

In FIGS. 1 and 2, the first direction X1 and the third direction X2 are illustrated as being the same direction as each other, but this is only for the convenience of explanation, and the present disclosure is not limited thereto. For example, the first direction X1 and the third direction X2 may be different directions from each other.

In some embodiments, the widths of the fins formed on the first region I may be the same as one another. For example, each of the widths W1 to W3 of the first to third fins F1 to F3 may be the same as one another. Here, the width means a width in the first direction X1. In some embodiments, each of the widths W1 to W3 of the first to third fins F1 to F3 may be 10 nm or less.

It is noted, however, that in the present specification, the term "same" means not only completely the same thing but also fine differences that may occur due to process margins and the like. For example, in a fine process in which a pitch between the fins is 30 nm or less, an error range of ±1 nm may be considered as the same range to those skilled in the art. As an example, a fin having the same width as the fin having the width of 7 nm may mean a fin having a width of 6 nm to 8 nm.

In some embodiments, the widths of the fins formed on the second region II may be the same as one another. For example, each of the widths W7 to W10 of the seventh to tenth fins F7 to F10 may be the same as one another. Here, the width means a width in the third direction X2. In some embodiments, each of the width W7 to W10 of the seventh to tenth fins F7 to F10 may be 10 nm or less.

In some embodiments, the width of the fins formed on the first region I may be the same as the width of the fins formed on the second region II. For example, each of the widths W1 to W3 of the first to third fins F1 to F3 may be the same as the width W7 of the seventh fin F7.

In some embodiments, the plurality of fins, e.g., the first to thirteenth fins F1 to F13, may be formed at the same level. As used herein, the term "same level" means the level formed by the same fabricating process.

The plurality of fins, e.g., the first to thirteenth fins F1 to F13, may constitute a plurality of first fin groups FG1 and a plurality of second fin groups FG2. The plurality of first fin groups FG1 may be formed on the first region I of the substrate 100, and may be arranged along the first direction X1. The plurality of second fin groups FG2 may be formed on the second region II of the substrate 100, and may be arranged along the third direction X2.

Each first fin group FG1 may include a plurality of fins. In some embodiments, each first fin group FG1 may include two fins. For example, one first fin group FG1 may include first and second fins F1 and F2, another first fin group FG1 may include third and fourth fins F3 and F4, and still another first fin group FG1 may include fifth and sixth fins F5 and F6.

Each second fin group FG2 may include a plurality of fins. In some embodiments, each second fin group FG2 may include three or more fins. For example, one second fin group FG2 may include seventh to ninth fins F7 to F9, and another second fin group FG2 may include tenth to twelfth fins F10 to F12.

Respective fins in each of the second fin groups FG2 may be disposed at the same pitch. For example, the seventh and eighth fins F7 and F8 may be disposed at a first fin pitch FP1, and the eighth and ninth fins F8 and F9 may also be disposed at the first fin pitch FP1. In some embodiments, the first fin pitch FP1 may be 30 nm or less. As described above, in the present specification, the term "same" means not only completely the same thing but also fine differences that may occur due to process margins and the like.

Each second fin group FG2 may be disposed at a pitch that is an integral multiple of the first fin pitch FP1. For example, as illustrated in FIG. 2, adjacent second fin groups FG2 may be disposed at a first group pitch GP1 relative to each other, e.g., the first group pitch GP1 may be measured as a distance between respective first fins in the adjacent second fin groups FG2. For example, each second fin group FG2 may be disposed at the first group pitch GP1 that is m times (here, m is a natural number of four or more) the first fin pitch FP1, e.g., GP1=m·FP1 (with "m" being four or larger). As such, as illustrated in FIG. 2, a pitch between outermost facing fins of the adjacent second fin groups FG2 (i.e., a second fin pitch FP2) may be larger than the first fin pitch FP1. For example, the ninth and tenth fins F9 and F10 (i.e., outermost facing fins of the adjacent second fin groups FG2) may be disposed at the second fin pitch FP2 which is n times (here, n is a natural number of two or more) the first fin pitch FP1, e.g., FP2=n·FP1 (with "n" being two or larger). For example, in some embodiments, the first group pitch GP1 may be five times the first fin pitch FP1, and the second fin pitch FP2 may be three times the first fin pitch FP1.

Respective fins in each of the first fin groups FG1 may be disposed at the same pitch. For example, the first and second fins F1 and F2 may be disposed at a third fin pitch FP3, and the third and fourth fins F3 and F4 may be disposed at the third fin pitch FP3. The fins in the first fin group FG1 may be disposed at a pitch equal to or smaller than the first fin pitch FP1. For example, as illustrated in FIG. 1, the first and second fins F1 and F2 may be disposed the third fin pitch FP3 that is equal the first fin pitch FP1.

For example, as illustrated in FIG. 2, adjacent first fin groups FG1 may be disposed at a second group pitch GP2 relative to each other. Each first fin group FG1 may be disposed at the second group pitch GP2 smaller than four times the first fin pitch FP1, e.g., 3·FP1<GP2<4·FP1. As such, as illustrated in FIG. 2, a pitch between outermost facing fins of the adjacent first fin groups FG1 (i.e., a fourth fin pitch FP4) may be larger than the first fin pitch FP1. For example, the second and third fins F2 and F3 (i.e., outermost facing fins of the adjacent first fin groups FG1) may be disposed at the fourth fin pitch FP4 which is larger than twice the first fin pitch FP1 and smaller than three times the first fin pitch FP1, e.g., 2·FP1<FP4<3·FP1.

The first field insulating film 110 may be formed on the first region I of the substrate 100. The first field insulating film 110 may cover at least some of the side walls of the portion of the plurality of fins on the first region I, i.e., at least some of the side walls of the first to sixth fins F1 to F6. For example, as illustrated in FIG. 2, some of the side walls of each of the first to sixth fins F1 to F6 may be defined by the first field insulating film 110. Also, the first field insulating film 110 may separate each of the first fin groups FG1.

The second field insulating film 115 may be formed on the second region II of the substrate 100. The second field insulating film 115 may cover at least some of the side walls of the portion of the plurality of fins on the second region II, i.e., at least some of the side walls of the seventh to thirteenth fins F7 to F13. For example, as illustrated in FIG. 2, some of the side walls of each of the seventh to thirteenth fins F7 to F13 may be defined by the second field insulating film 115. Also, the second field insulating film 115 may separate the respective second fin groups FG2.

In some embodiments, a width FW1 of the first field insulating film 110 which separates the respective first fin groups FG1 may be smaller than a width FW2 of the second field insulating film 115 which separates the respective second fin groups FG2. For example, the second and third fins F2 and F3 may be disposed at the fourth fin pitch FP4 smaller than three times the first fin pitch FP1, and the ninth and ninth fins F9 and F10 may be disposed at the second fin pitch FP2 three times the first fin pitch FP1. Since the width W2 of the second fin F2 may be the same as the width W9 of the ninth fin F9, the width FW1 of the first field insulating film 110 which separates the second fin F2 and the third fin F3 may be smaller than the width FW2 of the second field insulating film 115 which separates the ninth fin F9 and the tenth fin F10.

Figure 3:
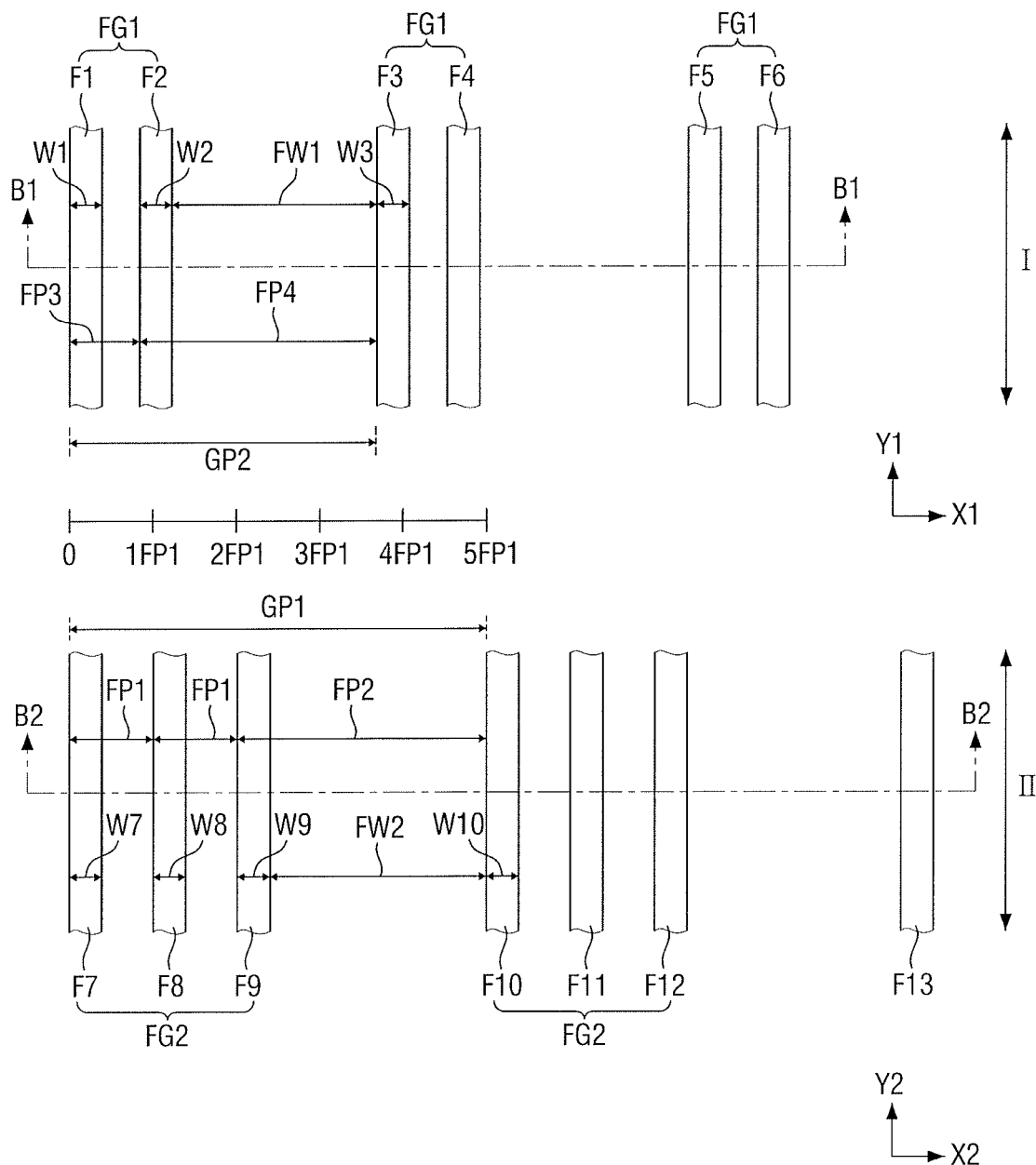
FIG. 3 illustrates a layout diagram of a semiconductor device according to some embodiments.
Figure 4:
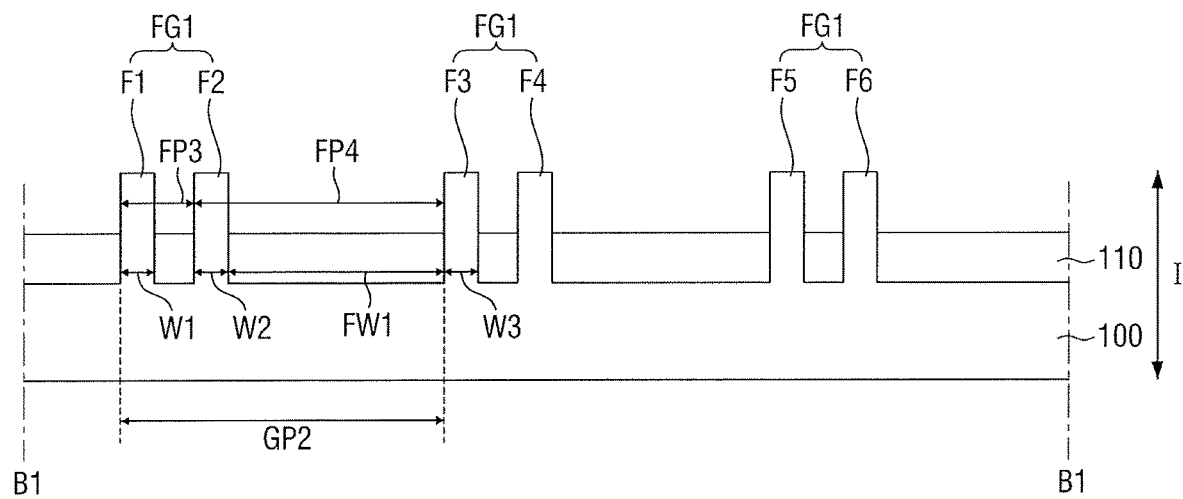
FIG. 4 illustrates a cross-sectional view along lines B1-B1 and B2-B2 of FIG. 3.
Figure 4:
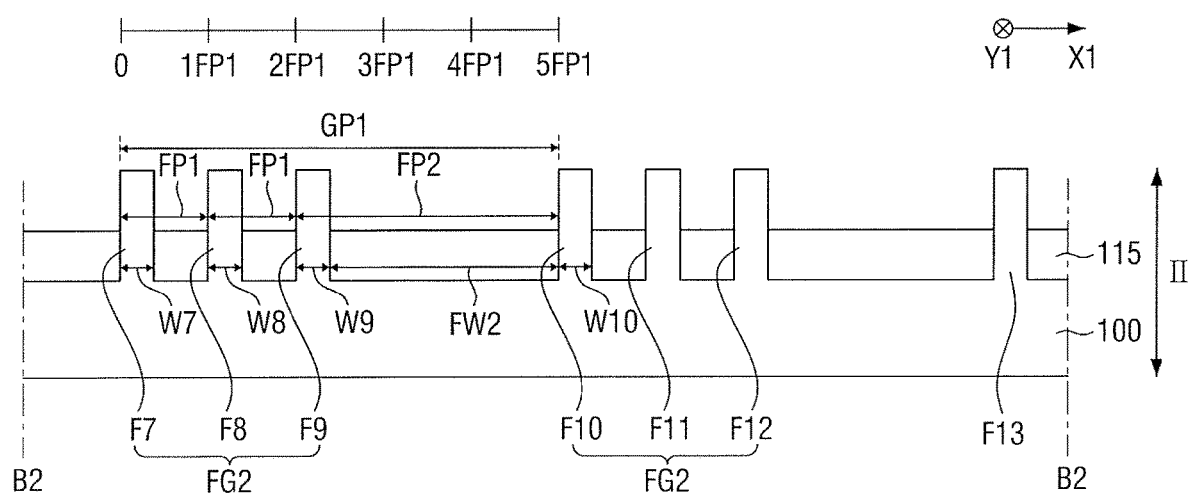

FIG. 3 is a layout diagram of a semiconductor device according to some embodiments. FIG. 4 is a cross-sectional view taken along lines B1-B1 and B2-B2 of FIG. 3. For convenience of description, parts already described above with respect to FIGS. 1 and 2 will be only briefly described or omitted.

Referring to FIGS. 3 and 4, in the semiconductor device according to some embodiments, the fins in the first fin group FG1 are disposed at a pitch smaller than the first fin pitch FP1. For example, the first and second fins F1 and F2 may be disposed at a third fin pitch FP3 that is smaller than the first fin pitch FP1.

In some embodiments, each first fin group FG1 may be disposed at a second group pitch GP2 which is than three times the first fin pitch FP1 and smaller than four times the first fin pitch FP1. For example, the second group pitch GP2 of FIG. 3 may be the same as the second group pitch GP2 of FIG. 1. In such a case, the third fin pitch FP3 of FIG. 3 may be smaller than the third fin pitch FP3 of FIG. 1, and the fourth fin pitch FP4 of FIG. 3 may be greater than the fourth fin pitch FP4 of FIG. 1.

In some embodiments, the width FW1 of the first field insulating film 110 of FIG. 3 which separates the respective first fin groups FG1 may be greater than the width FW1 of the first field insulating film 110 of FIG. 1 which separates the respective first fin groups FG1.

Figure 5:
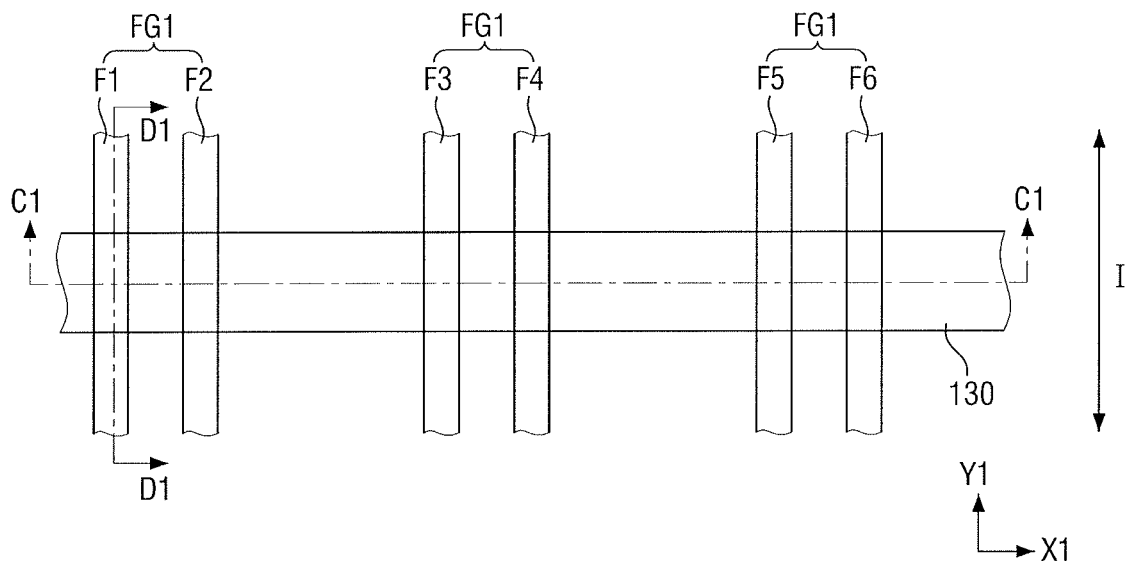
FIG. 5 illustrates a layout diagram of a semiconductor device according to some embodiments.
Figure 5:
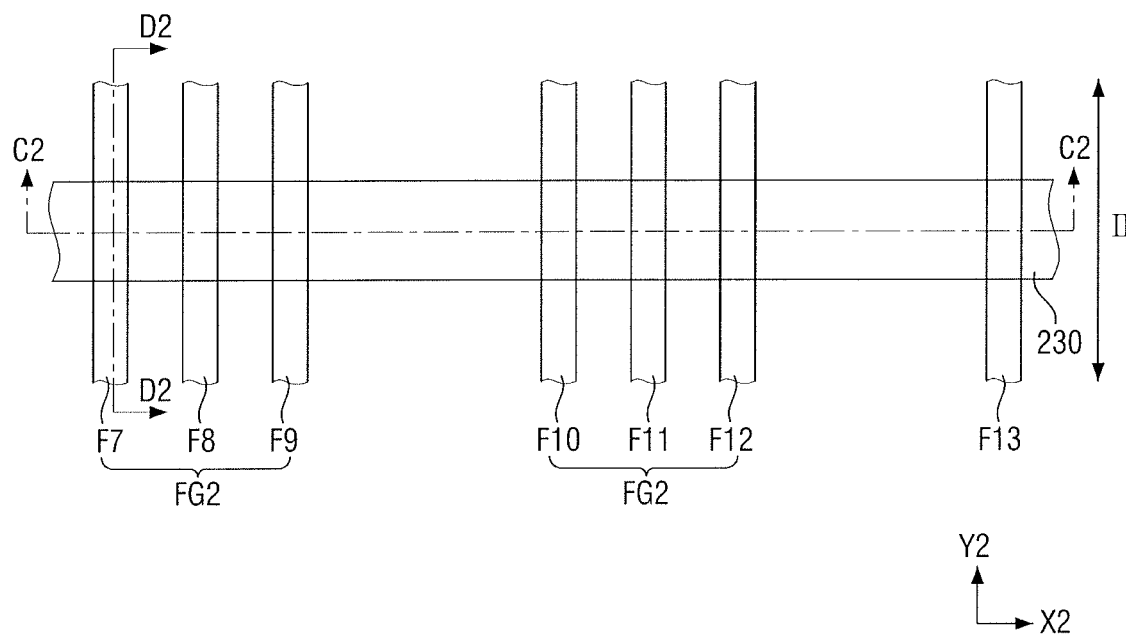
Figure 6:
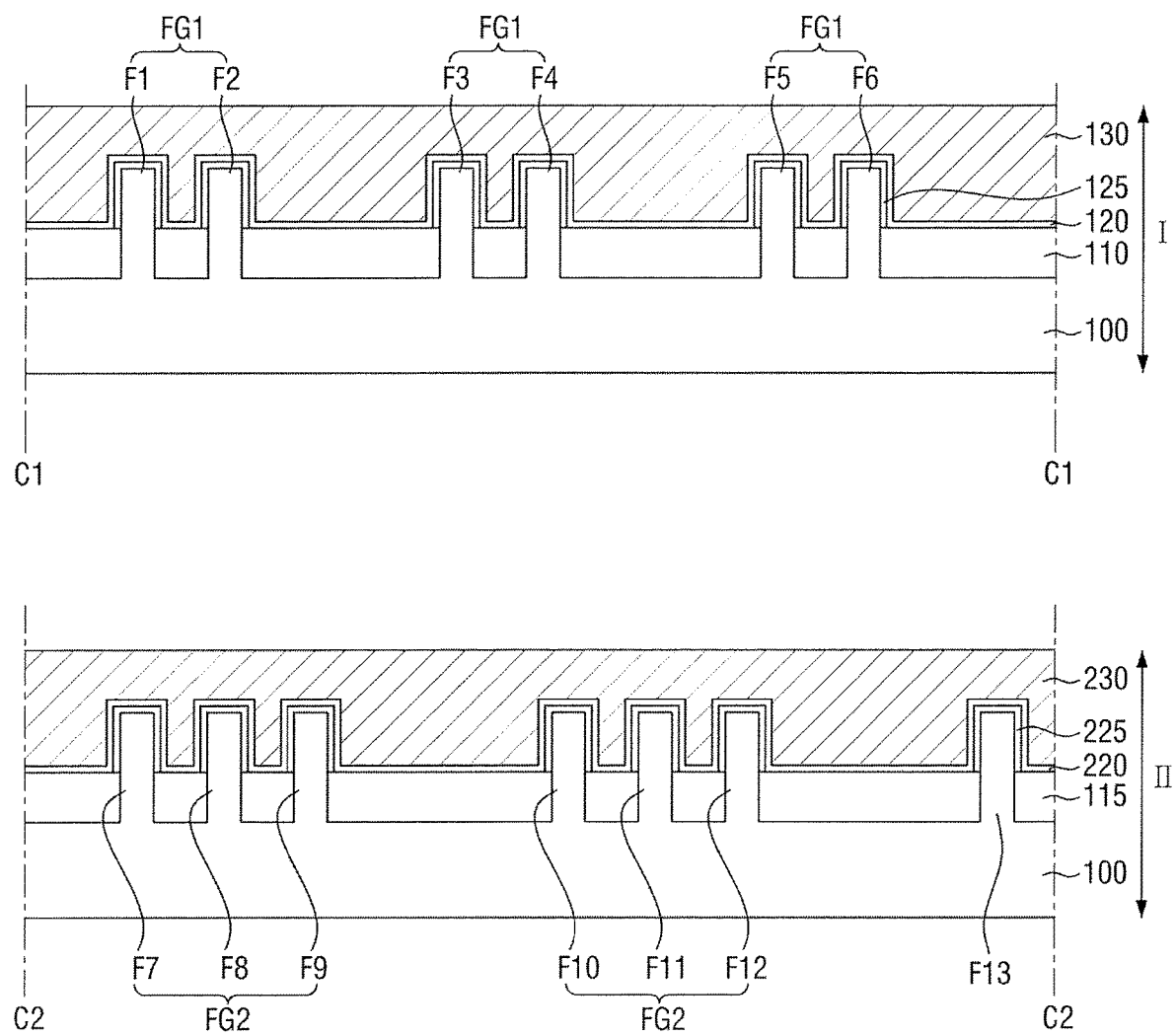
FIG. 6 illustrates a cross-sectional view along lines C1-C1 and C2-C2 of FIG. 5.
Figure 7:
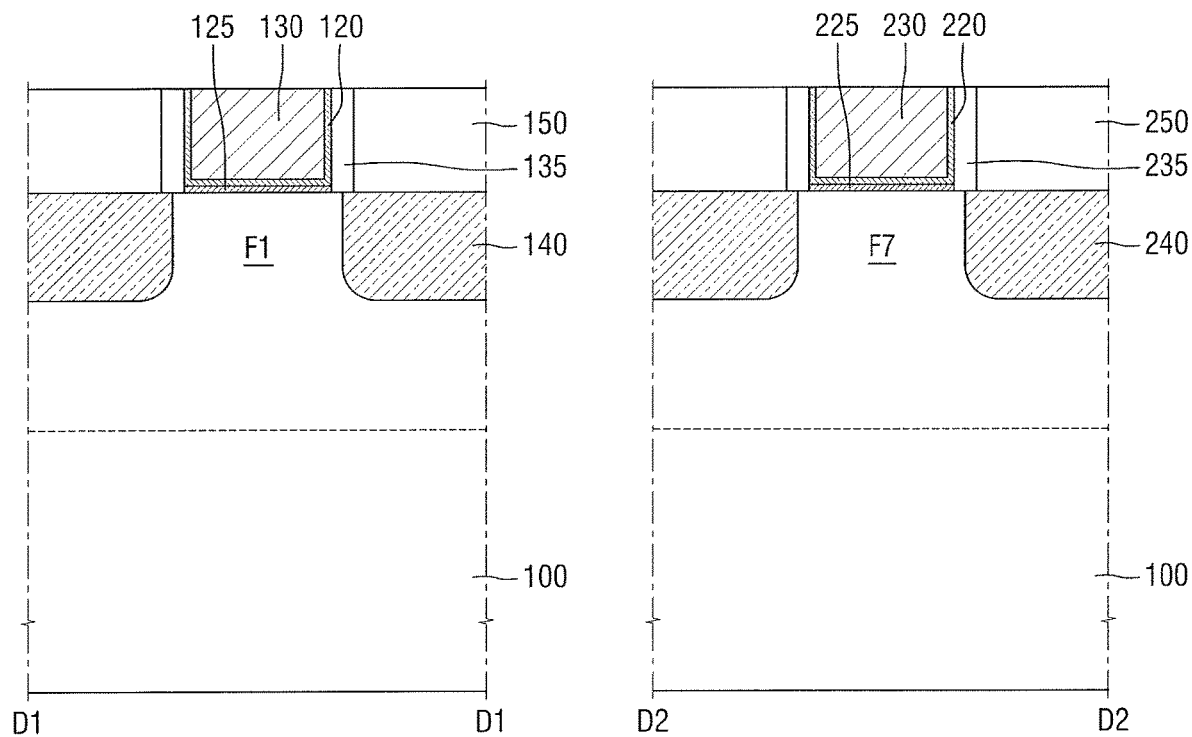
FIG. 7 illustrates a cross-sectional view along lines D1-D1 and D2-D2 of FIG. 5.

FIG. 5 is a layout diagram of a semiconductor device according to some embodiments. FIG. 6 is a cross-sectional view taken along lines C1-C1 and C2-C2 of FIG. 5. FIG. 7 is a cross-sectional view taken along lines D1-D1 and D2-D2 of FIG. 5. For convenience of description, parts already described above with respect to FIGS. 1 and 2 will be only briefly described or omitted.

Referring to FIGS. 5 to 7, a semiconductor device according to some embodiments further may include a first gate electrode 130, a first gate dielectric film 120, a first gate spacer 135, a first source/drain region 140, a first interlayer insulating film 150, a second gate electrode 230, a second gate dielectric film 220, a second gate spacer 235, a second source/drain region 240, and a second interlayer insulating film 250.

The first gate electrode 130 may be formed on the first to sixth fins F1 to F6. The first gate electrode 130 may extend long in a direction intersecting the first to sixth fins F1 to F6. For example, the first gate electrode 130 may extend in the first direction X1.

The second gate electrode 230 may be formed on the seventh to thirteenth fins F7 to F13. The second gate electrode 230 may extend long in a direction intersecting the seventh to thirteenth fins F7 to F13. For example, the second gate electrode 230 may extend in the third direction X2.

The first gate electrode 130 and the second gate electrode 230 may include a conductive material. In some embodiments, the first gate electrode 130 and the second gate electrode 230 may be formed at the same level. For example, the first gate electrode 130 and the second gate electrode 230 may have the same material configuration.

The first gate dielectric film 120 may be interposed between the first to sixth fins F1 to F6 and the first gate electrode 130. For example, the first gate dielectric film 120 may extend along the side walls and the upper surfaces of each of the first to sixth fins F1 to F6. In some embodiments, the first gate dielectric film 120 may also be interposed between the first field insulating film 110 and the first gate electrode 130. For example, the first gate dielectric film 120 may further extend along the upper surface of the first field insulating film 110.

The second gate dielectric film 220 may be interposed between the seventh to thirteenth fins F7 to F13 and the second gate electrode 230. For example, the second gate dielectric film 220 may extend along the side walls and the upper surfaces of respective seventh to thirteenth fins F7 to F13. In some embodiments, the second gate dielectric film 220 may also be interposed between the second field insulating film 115 and the second gate electrode 230. For example, the second gate dielectric film 220 may further extend along the upper surface of the second field insulating film 115.

The first gate dielectric film 120 and the second gate dielectric film 220 may include, e.g., at least one of silicon oxide, silicon oxynitride, silicon nitride, and a high-k material having a dielectric constant higher than that of silicon oxide.

The semiconductor device according to some embodiments may further include a first interface film 125 and a second interface film 225. The first interface film 125 may be interposed between the first to sixth fins F1 to F6 and the first gate dielectric film 120, and the second interface film 225 may be disposed between the seventh to thirteenth fins F7 to F13 and the second gate dielectric film 220.

The first gate spacer 135 may extend along both side walls of the first gate electrode 130. The second gate spacer 235 may extend along both side walls of the second gate electrode 230.

The first source/drain region 140 may be formed in the first to sixth fins F1 to F6. The second source/drain region 240 may be formed in the seventh to thirteenth fins F7 to F13.

The first interlayer insulating film 150 may be formed on the first region I of the substrate 100. The first interlayer insulating film 150 may cover the first field insulating film 110, the first source/drain region 140, and the first gate spacer 135.

The second interlayer insulating film 250 may be formed on the second region II of the substrate 100. The second interlayer insulating film 250 may cover the second field insulating film 115, the second source/drain region 240, and the second gate spacer 235.

Figure 8:
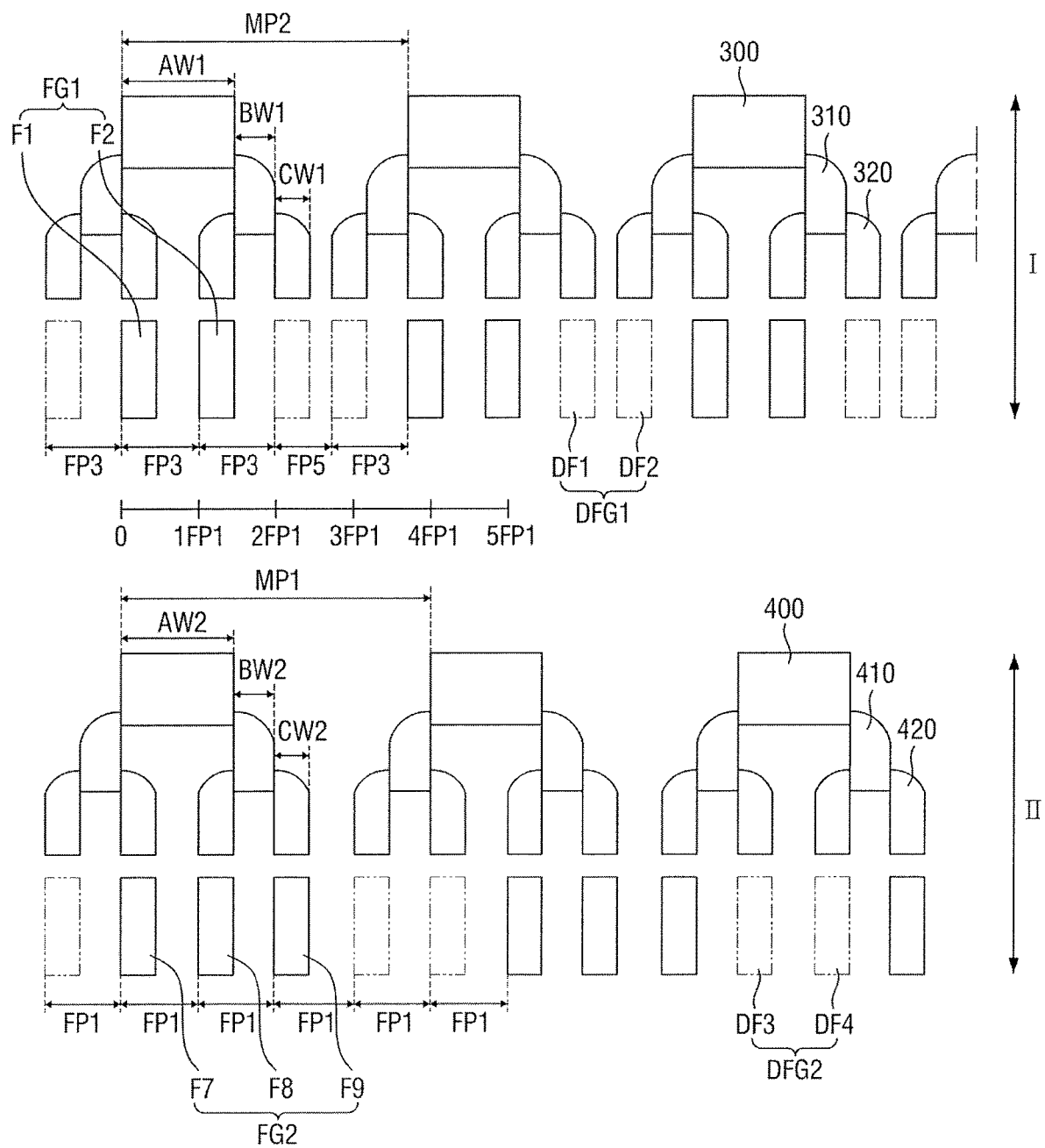
FIG. 8 illustrates a conceptual view of a method for fabricating a semiconductor device according to some embodiments.

Hereinafter, the semiconductor device according to some embodiments will be described with reference to FIGS. 8 through 17. FIG. 8 is a conceptual view illustrating a method for fabricating a semiconductor device according to some embodiments. FIGS. 9 to 17 are intermediate stage diagrams of the method for fabricating the semiconductor device according to FIG. 8. For convenience of description, parts already described above with respect to FIGS. 1 and 2 will be only briefly described or omitted.

As illustrated in FIGS. 8 to 17, a method for fabricating the semiconductor device according to some embodiments may include performing a self-aligned quadruple patterning (SAQP) process, using first and second mandrel patterns 300 and 400. For example, first and second upper spacers 310 and 410 may be formed using the first and second mandrel patterns 300 and 400, first and second lower spacers 320 and 420 may be formed using the first and second upper spacers 310 and 410, and the plurality of first fin groups FG1 and the plurality of second fin groups FG2 may be formed using the first and second lower spacers 320 and 420.

Figure 9:
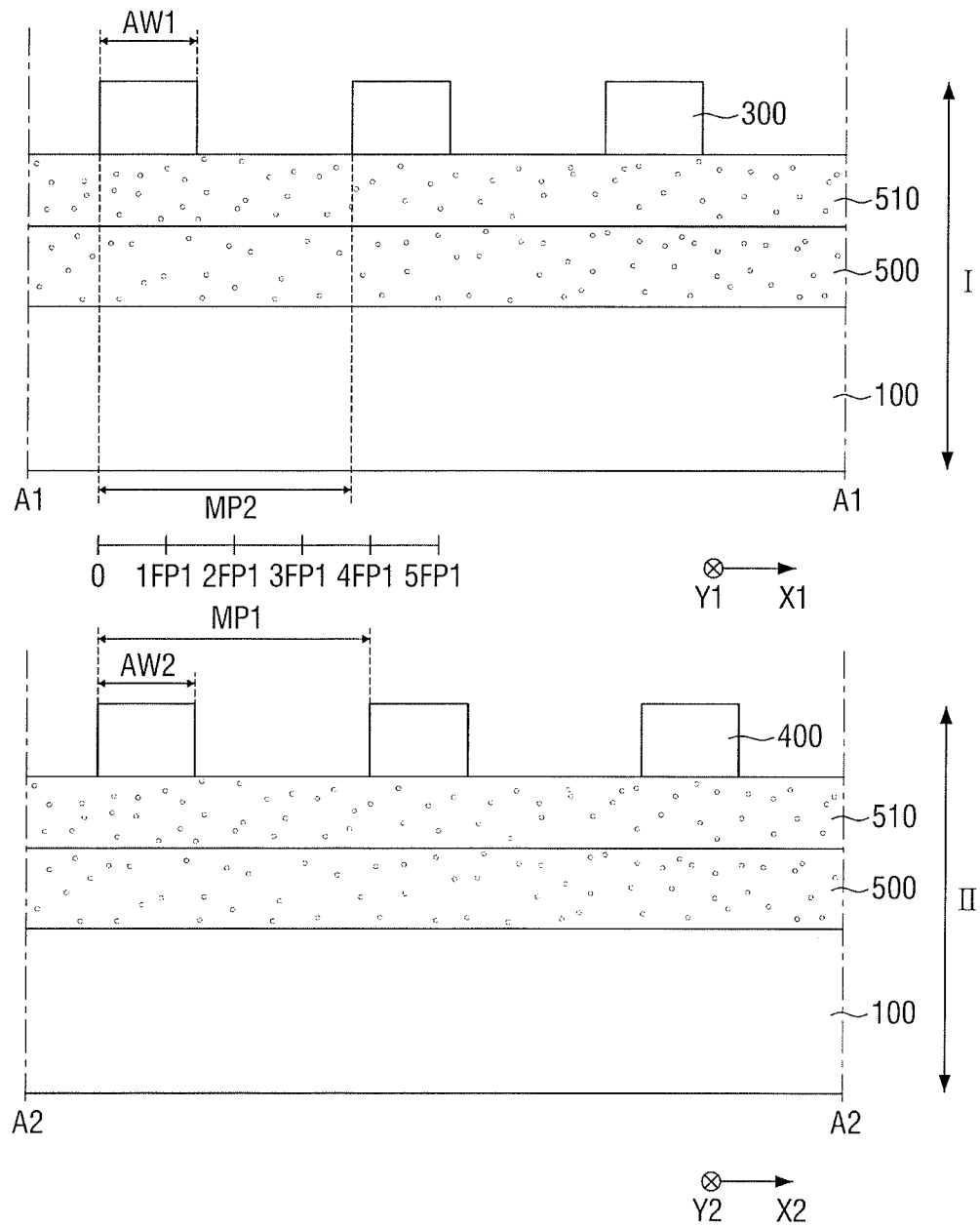
FIGS. 9 to 17 illustrate stages in a method for fabricating a semiconductor device according to some embodiments.

In detail, referring to FIGS. 8 and 9, a hard mask film 500 and a sacrificial film 510 may be sequentially formed on the substrate 100. Subsequently, a plurality of first mandrel patterns 300 may be formed on the first region I, and a plurality of second mandrel patterns 400 may be formed on the second region II. The first and second mandrel patterns 300 and 400 may be formed, e.g., on the sacrificial film 510.

For example, the plurality of layers of the hard mask film 500 may include at least one of a silicon-containing material, e.g., silicon oxide, silicon oxynitride, silicon nitride, TEOS (TetraEthylOrthoSilicate) or polycrystalline silicon, a carbon-containing material, e.g., ACL (amorphous carbon layer) or SOH (Spin-On Hardmask), or metals.

In some embodiments, the hard mask film 500 may be formed of multi-films. For example, a lower layer of the multi-films may be formed of a silicon nitride layer, an intermediate layer thereof may be formed of silicon oxide, and an upper layer thereof may be formed of polycrystalline silicon. The lower layer may further include, e.g., a thin silicon oxide below the silicon nitride. However, this is only an example and the technical concept of the present disclosure is not limited thereto.

The sacrificial film 510 may include, e.g., polycrystalline silicon, an amorphous carbon layer (ACL) or a spin-on hardmask (SOH).

Formation of the first mandrel pattern 300 and the second mandrel pattern 400 may be performed by, e.g., a photolithography process. For example, the first mandrel pattern 300 and the second mandrel pattern 400 may be patterns onto which a photoresist is transferred.

In some embodiments, a pitch between the first mandrel patterns 300 may be smaller than a pitch between the second mandrel patterns 400. For example, each second mandrel pattern 400 may be disposed at a first mandrel pitch MP1, and each first mandrel pattern 300 may be disposed at a second mandrel pitch MP2 smaller than the first mandrel pitch MP1.

In some embodiments, as illustrated in FIG. 8, the first mandrel pitch MP1 may be determined to be four times the first fin pitch FP1, and the second mandrel pitch MP2 may be determined to be smaller than four times the first fin pitch FP1. For example, the second mandrel pitch MP2 may be determined to be greater than three times the first fin pitch FP1 and smaller than four times the first fin pitch FP1.

In some embodiments, a width AW1 of the first mandrel pitch 1V1P1 may be the same as a width AW2 of the second mandrel pitch MP2.

Figure 10:
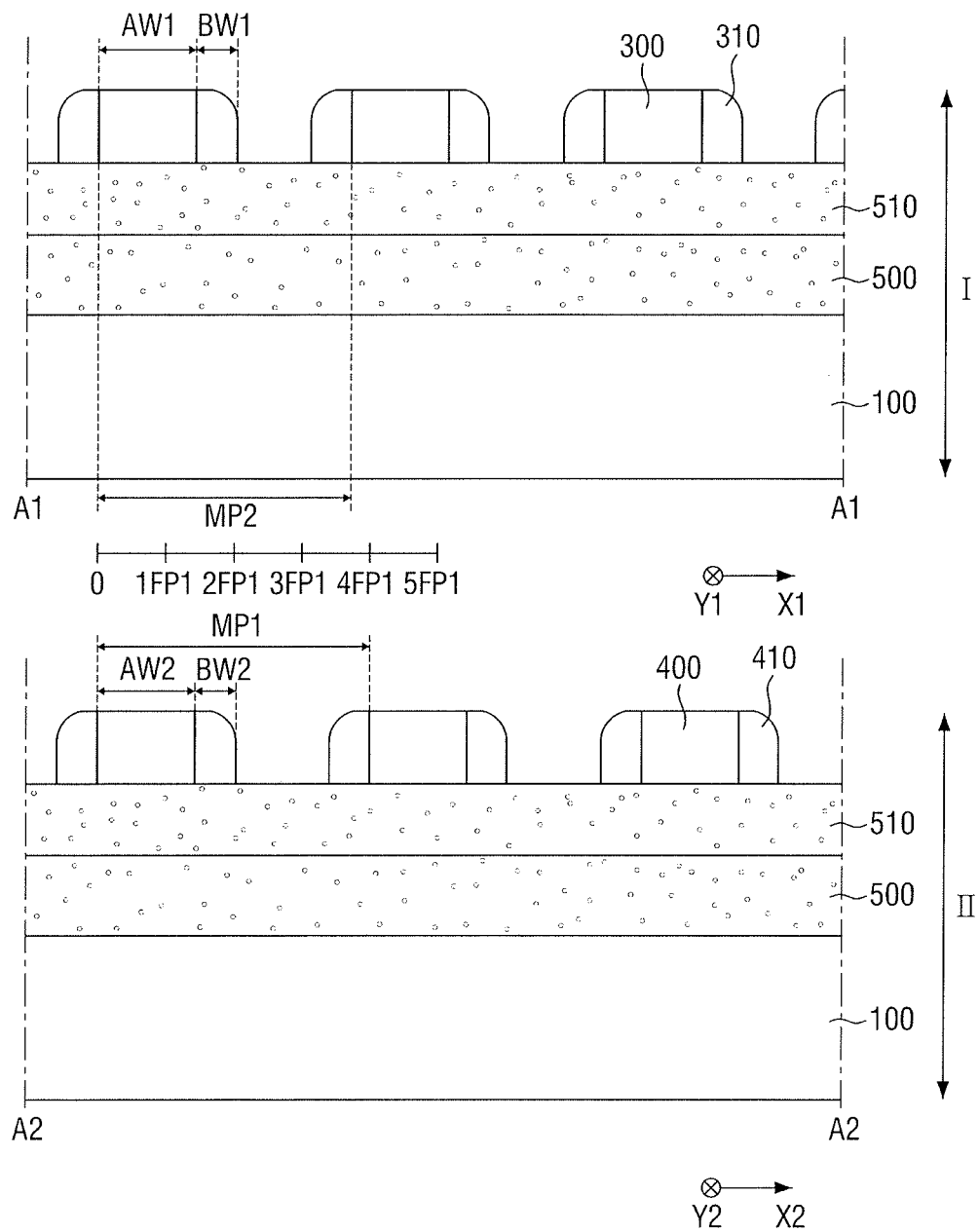

Referring to FIGS. 8 and 10, a first upper spacer 310 may formed on both side walls of the first mandrel pitch MP1, and a second upper spacer 410 may be formed on both side walls of the second mandrel pitch MP2.

For example, a first spacer film which extends along the side walls and the upper surface of the first mandrel pattern 300, the side walls and the upper surface of the second mandrel pattern 400, and the upper surface of the sacrificial film 510 may be formed. The first spacer film may be formed by, e.g., an atomic layer deposition (ALD), a chemical vapor deposition (CVD), or the like. Subsequently, an anisotropic etching process may be performed. Thus, the first upper spacer 310 may be formed on both side walls of the first mandrel pattern 300, and the second upper spacer 410 may be formed on both side walls of the second mandrel pattern 400. The first upper spacer 310 and the second upper spacer 410 may include, e.g., at least one of silicon oxide, silicon nitride, silicon oxynitride, and a combination thereof.

A width BW1 of the first upper spacer 310 may be adjusted appropriately to form the first fin group FG1 and a first dummy fin group DFG1. Similarly, a width BW2 of the second upper spacer 410 may be adjusted appropriately to form the second fin group FG2 and a second dummy fin group DFG2. In some embodiments, the width BW1 of the first upper spacer 310 may be the same as the width BW2 of the second upper spacer 410.

Figure 11:
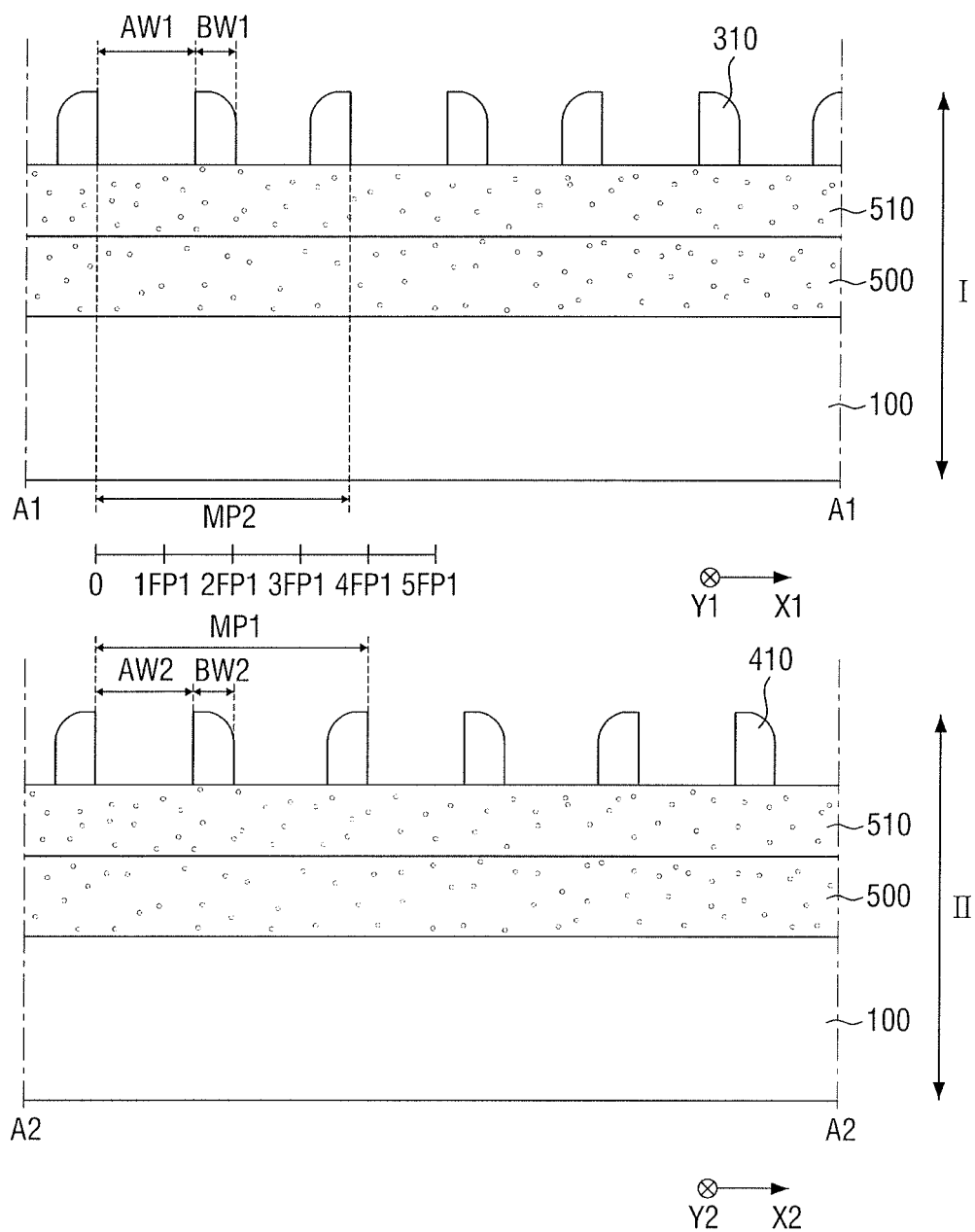

Subsequently, referring to FIG. 11, the first mandrel pattern 300 and the second mandrel pattern 400 on the sacrificial film 510 may be removed.

Figure 12:
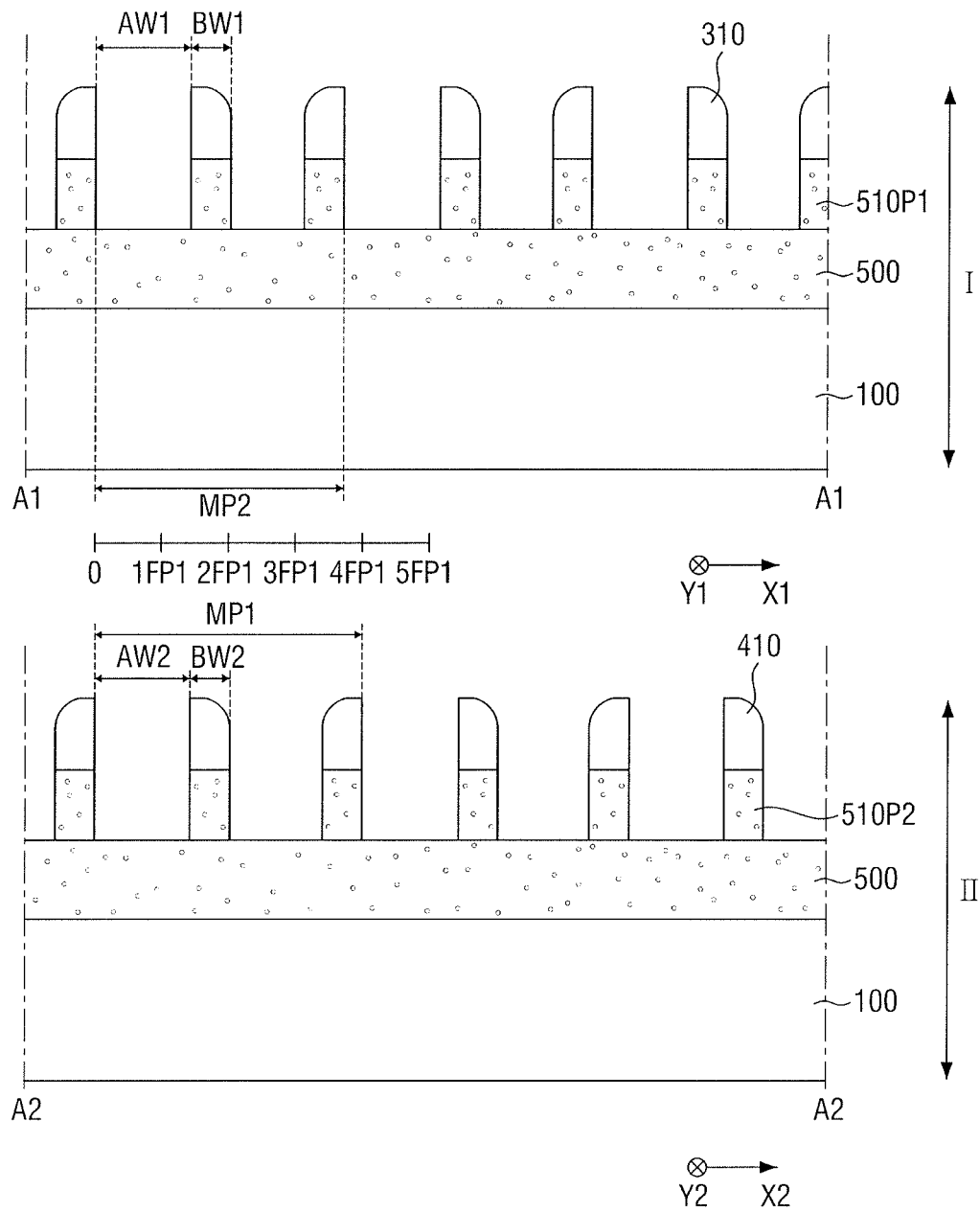

Referring to FIGS. 8 and 12, the sacrificial film 510 may be patterned, using the first upper spacer 310 and the second upper spacer 410 as an etching mask. Therefore, a first sacrificial pattern 510P1 may be formed on the hard mask film 500 of the first region I, and a second sacrificial pattern 510P2 may be formed on the hard mask film 500 of the second region II. That is, the first sacrificial pattern 510P1 may be a pattern onto which the first upper spacer 310 is transferred, and the second sacrificial pattern 510P2 may be a pattern onto which the second upper spacer 410 is transferred. After the first sacrificial pattern 510P1 and the second sacrificial pattern 510P2 are formed, the first upper spacer 310 and the second upper spacer 410 may be removed.

Figure 13:
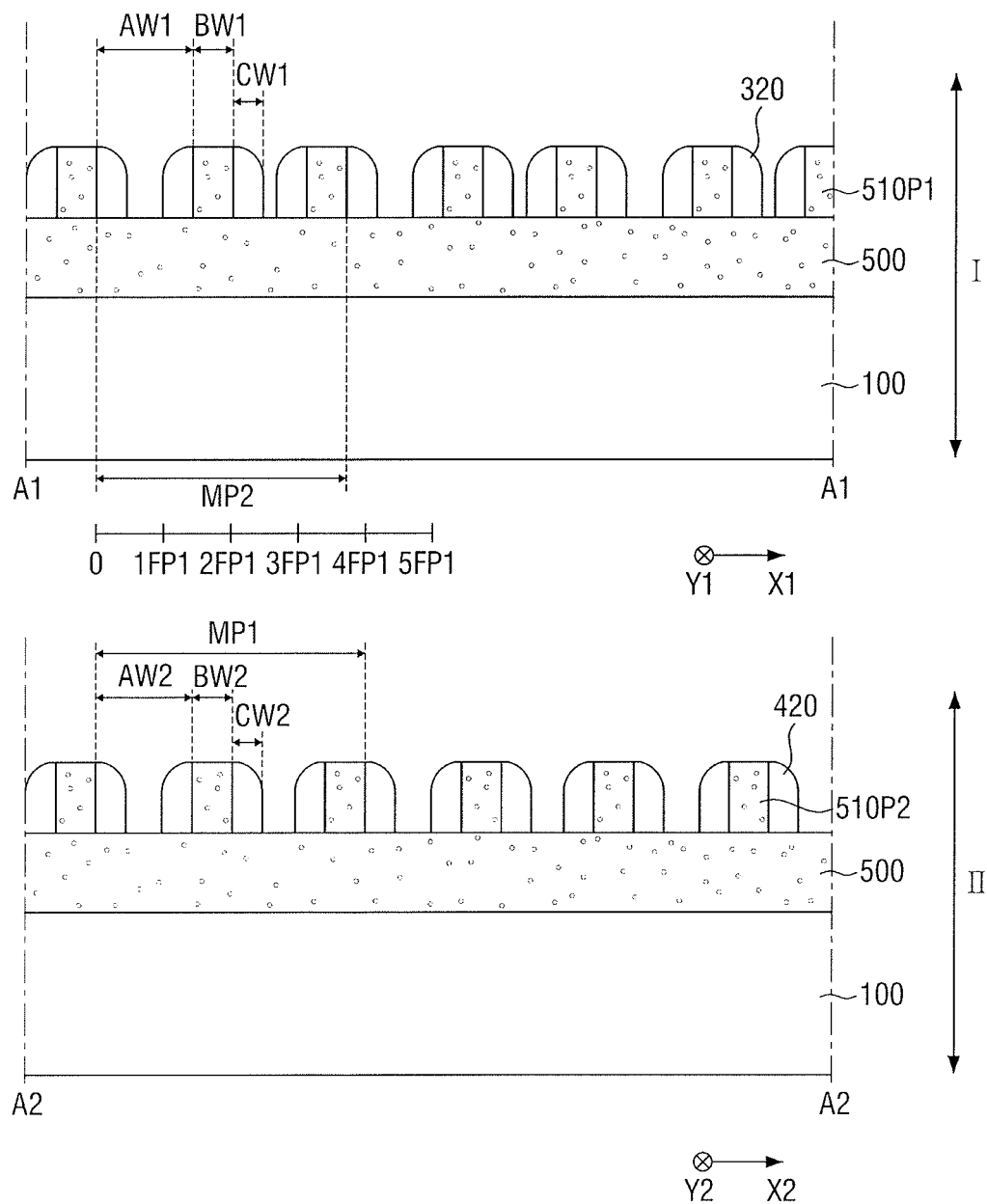

Referring to FIGS. 8 and 13, the first lower spacer 320 may be formed on both side walls of the first sacrificial pattern 510P1, and the second lower spacer 420 may be formed on both side walls of the second sacrificial pattern 510P2.

For example, the second spacer film extending along the side walls and the upper surface of the first sacrificial pattern 510P1, the side walls and the upper surface of the second sacrificial pattern 510P2, and the upper surface of the sacrificial film 510 may be formed. Subsequently, an anisotropic etching process may be performed. Thus, the first lower spacer 320 may be formed on both side walls of the first sacrificial pattern 510P1, and the second lower spacer 420 may be formed on both side walls of the second sacrificial pattern 510P2. The first lower spacer 320 and the second lower spacer 420 may include, e.g., at least one of silicon oxide, silicon nitride, silicon oxynitride, and combinations thereof.

A width CW1 of the first lower spacer 320 may be adjusted appropriately to form the first fin group FG1 and the first dummy fin group DFG1. Similarly, the width CW2 of the second lower spacer 420 may be adjusted appropriately to form the second fin group FG2 and the second dummy fin group DFG2. In some embodiments, the width CW1 of the first lower spacer 320 may be the same as the width CW2 of the second lower spacer 420.

Figure 14:
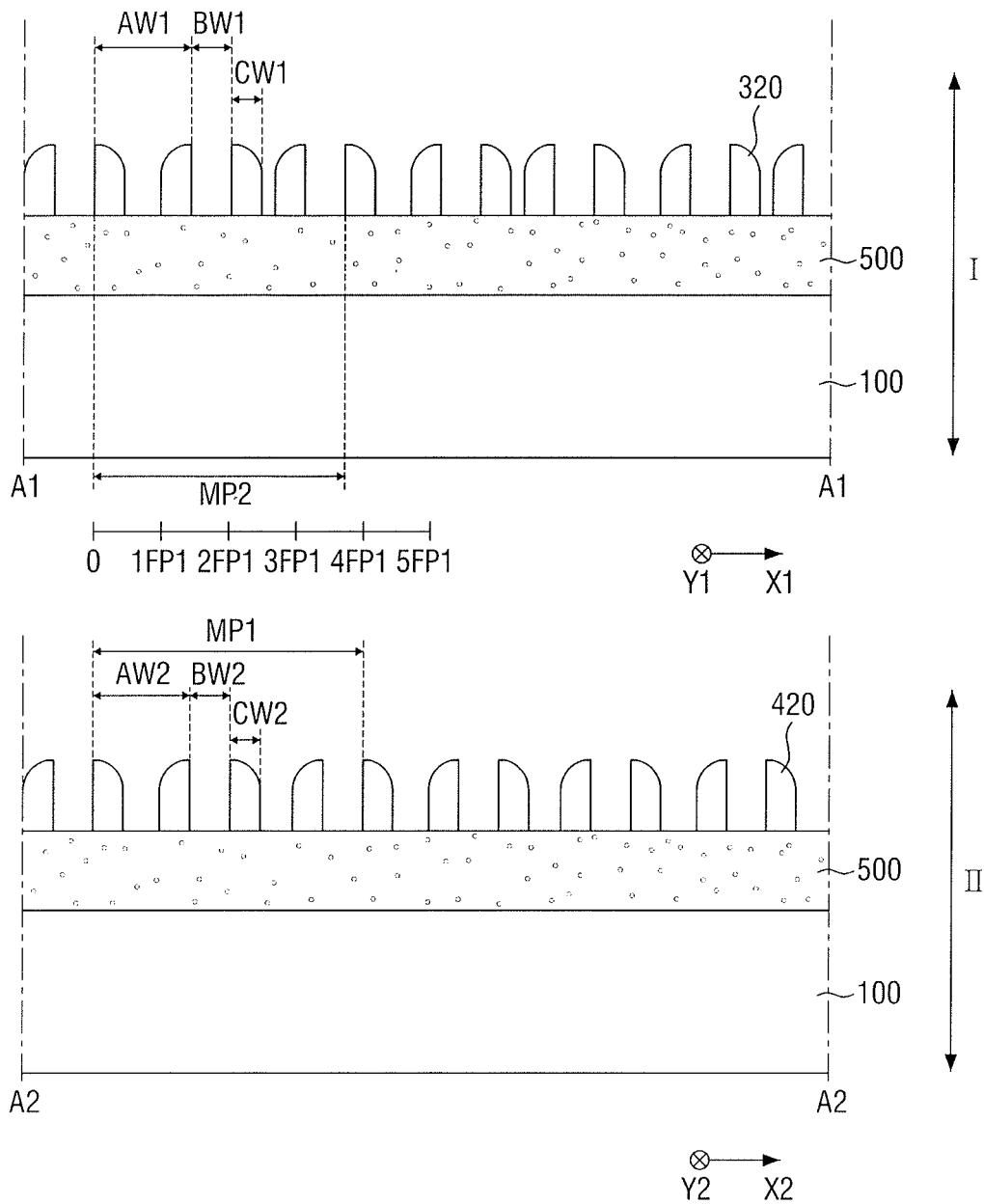

Subsequently, referring to FIG. 14, a first sacrificial pattern 510P1 and a second sacrificial pattern 510P2 on the hard mask film 500 may be removed.

Figure 15:
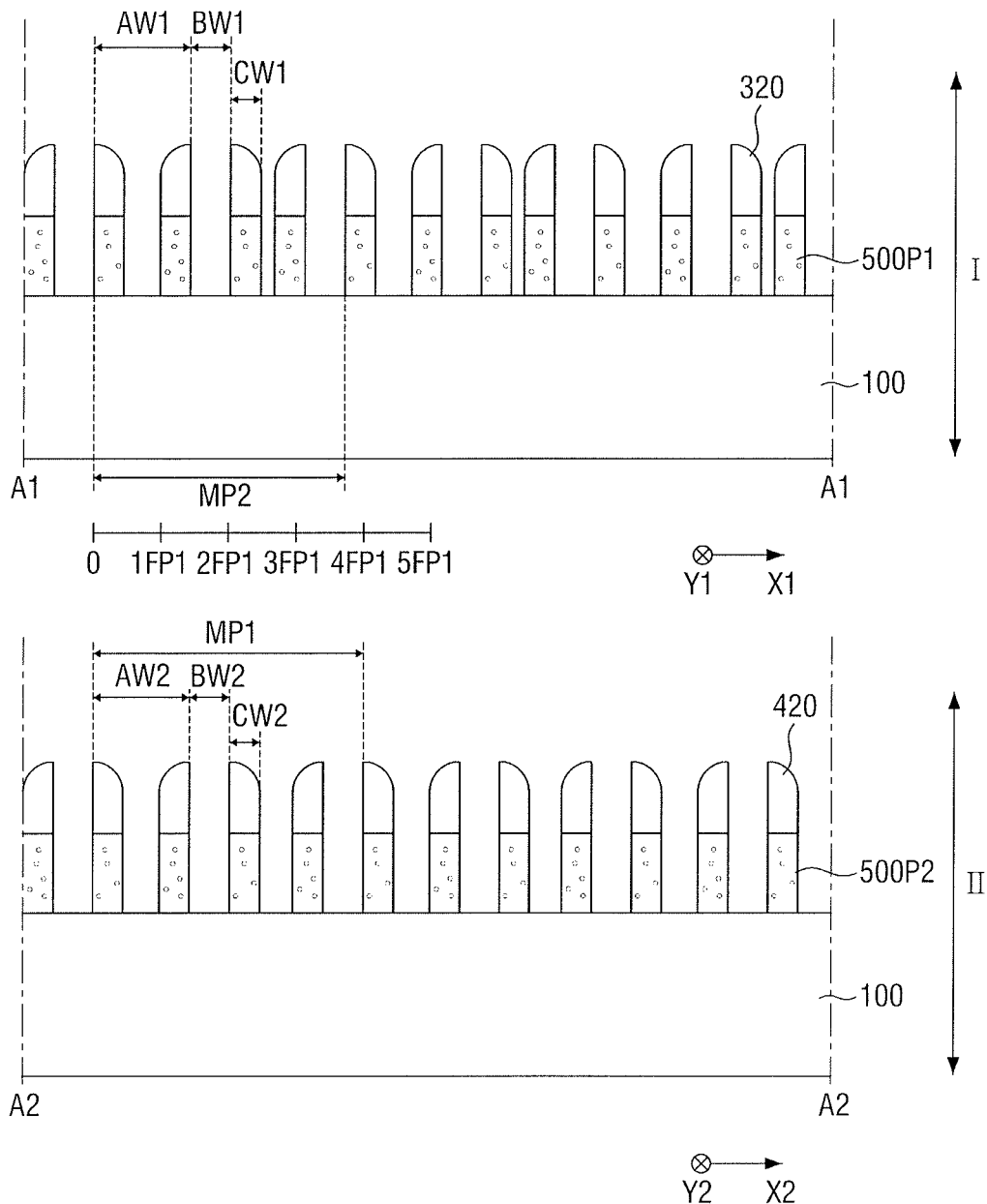

Subsequently, referring to FIG. 15, the hard mask film 500 may be patterned, using the first sacrificial pattern 510P1 and the second sacrificial pattern 510P2 as etching masks. Thus, a first hard mask pattern 500P1 may be formed on the substrate 100 of the first region I, and a second hard mask pattern 500P2 may be formed on the substrate 100 of the second region II.

After the first hard mask pattern 500P1 and the second hard mask pattern 500P2 are formed, the first lower spacer 320 and the second lower spacer 420 may be removed.

Figure 16:
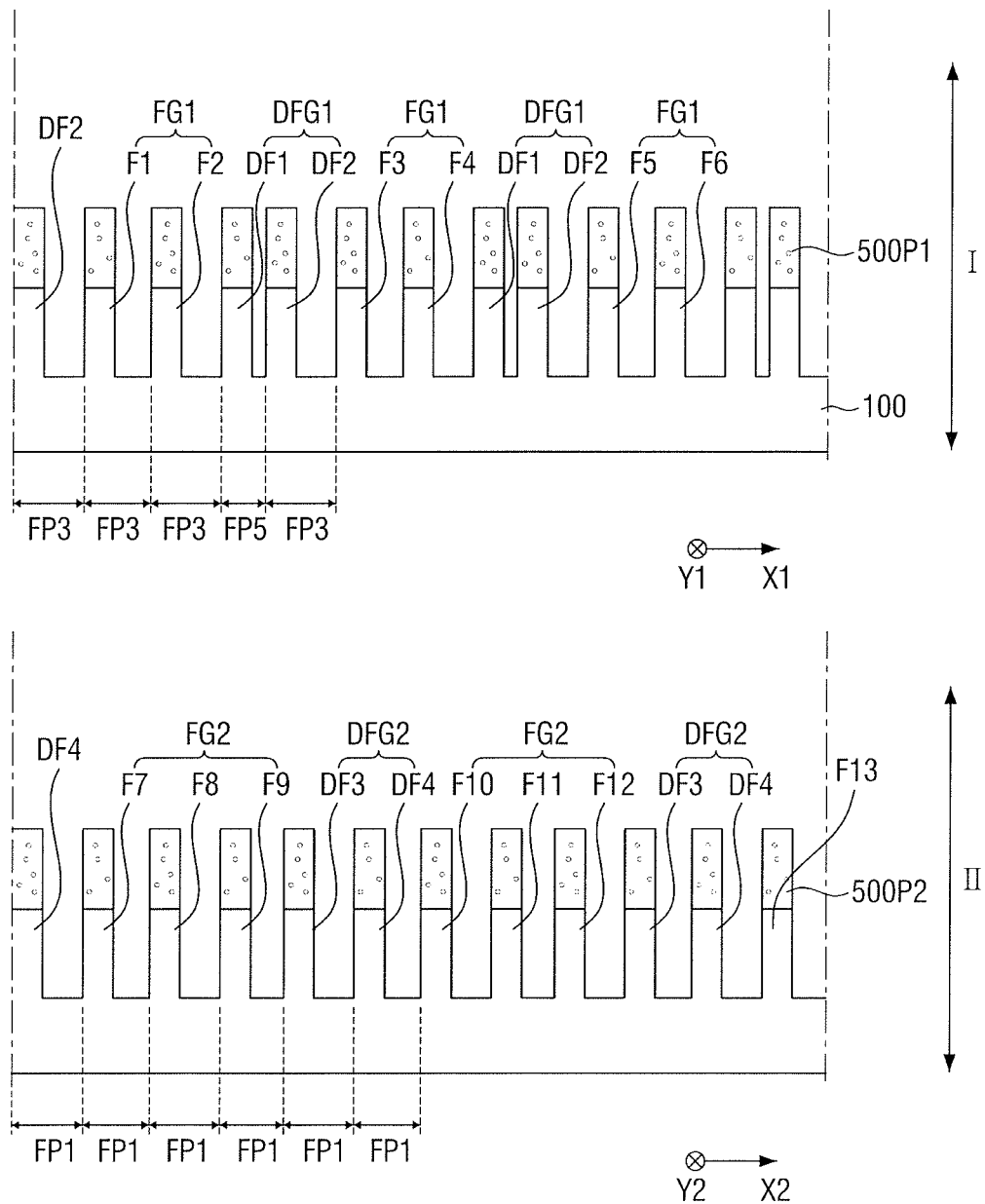

Referring to FIGS. 8 and 16, the substrate 100 may be patterned, using the first hard mask pattern 500P1 and the second hard mask pattern 500P2 as the etching masks. Therefore, the plurality of fins F1 to F13, and DF1 to DF4 may be formed on the substrate 100.

In some embodiments, the plurality of fins F1 to F6 and DF1, DF2 formed on the first region I of the substrate 100 may be divided into a plurality of first fin groups FG1, and a plurality of first dummy fin groups DFG1. Each first fin group FG1 may be made up of a plurality of fins. In some embodiments, each first fin group FG1 may include two fins. In some embodiments, as illustrated in FIG. 8, the first fin group FG1 may be formed in a region which overlaps the first mandrel pattern 300.

In some embodiments, the first fin group FG1 may be a set of fins having the same pitch as the fins on both sides adjacent thereto. For example, the first fin F1 in the first fin group FG1 may be disposed at the third fin pitch FP3 from both the second dummy fin DF2 and the second fin F2 adjacent thereto. Also, for example, as illustrated, the second fins F2 in the first fin group FG1 may be disposed at the third fin pitch FP3 from both the first fins F1 and the first dummy fins DF1 adjacent thereto.

Each first dummy fin group DFG1 may be interposed between the respective first fin groups FG1. For example, the plurality of first fin groups FG1 and the plurality of first dummy fin groups DFG1 may be alternately arranged along the first direction X1. In some embodiments, as illustrated in FIG. 8, the first dummy fin group DFG1 may be formed in a region which does not overlap the first mandrel pattern 300.

In some embodiments, the first dummy fin group DFG1 may be a set of fins having a pitch different from that of the fins on both sides adjacent thereto. For example, as illustrated in FIG. 16, the first dummy fin DF1 in the first dummy fin group DFG1 may be disposed at the third fin pitch FP3 from the second fin F2 adjacent to one side thereof, and may be disposed at a fifth fin pitch FP5 smaller than the third fin pitch FP3 from the second dummy fin DF2 adjacent to the other side thereof. Also, for example, as illustrated, the second dummy fin DF2 in the first dummy fin group DFG1 may be disposed at the fifth fin pitch FP5 from the first dummy fin DF1 adjacent to one side thereof, and may be disposed at the third fin pitch FP3 from the third fin F3 adjacent to the other side thereof.

Since the respective fins DF1 and DF2 constituting the first dummy fin group DFG1 have pitches different from those of the fins on both sides thereof, a loading effect may occur during the process of being transferred from the first lower spacer 320. Unlike this, since the respective fins F1 to F6 constituting the first fin group FG1 have the same pitch as the fins on both sides thereof, the loading effect may not occur in the process of being transferred from the first lower spacer 320.

The plurality of fins F7 to F13, DF3 and DF4 formed on the second region II of the substrate 100 may be divided into the plurality of second fin groups FG2 and a plurality of second dummy fin groups DFG2. Each second fin group FG2 may be made up of a plurality of fins. In some embodiments, each second fin group FG2 may include three or more fins. Each second dummy fin group DFG2 may be interposed between the respective second fin groups FG2. For example, the plurality of second fin groups FG2 and the plurality of second dummy fin groups DFG2 may be alternately arranged along the third direction X2.

The plurality of fins F7 to F13, DF3 and DF4 formed on the second region II of the substrate 100 may be disposed at the same pitch. For example, as illustrated in FIG. 16, the seventh to ninth fins F7 to F9, the third dummy fin DF3, the fourth dummy fin DF4, and the tenth fin F10 all may be disposed at the first fin pitch FP1. Since the respective fins F7 to F13, DF3 and DF4 formed on the second region II of the substrate 100 have the same pitch as the fins on both sides thereof, the loading effect may not occur in the process of being transferred from the second lower spacer 420.

In some embodiments, the fins in the first fin group FG1 may be disposed at a pitch equal to or smaller than the first fin pitch FP1. For example, as illustrated, the third fin pitch FP3 may be the same as the first fin pitch FP1.

After the plurality of fins F1 to F13 and DF1 to DF4 is formed, the first hard mask pattern 500P1 and the second hard mask pattern 500P2 may be removed.

Figure 17:
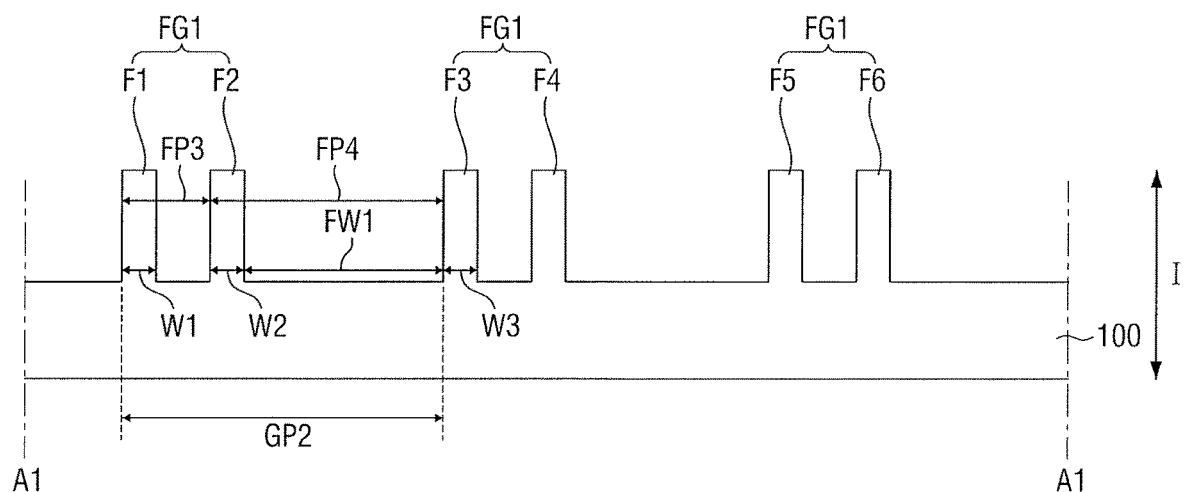
Figure 17:
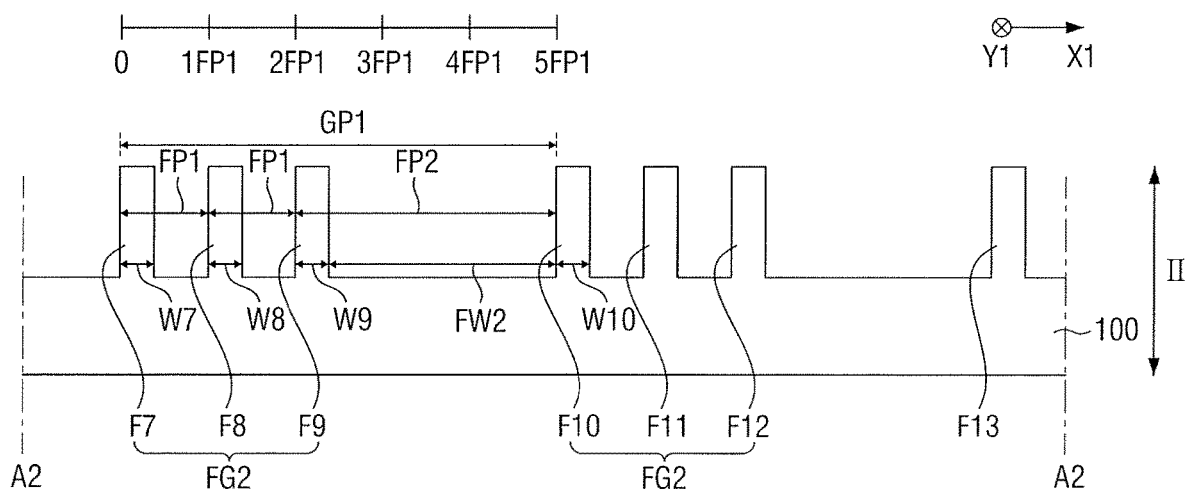

Referring to FIGS. 8 and 17, the first dummy fin group DFG1 and the second dummy fin group DFG2 may be removed. The removal of the first dummy fin group DFG1 and the second dummy fin group DFG2 may be performed by, e.g., a fin-cut process.

As described above, since a loading effect may not occur in the process of transferring the first fin group FG1 from the first lower spacer 320, the widths of the fins formed on the first region I may be the same as one another. For example, the widths W1 to W3 of each of the first to third fins F1 to F3 may be the same as one another.

Also, as described above, since the loading effect may not occur in the process of transferring the second fin group FG2 from the second lower spacer 420, the widths of the fins formed on the second region II may be the same as one another. For example, the widths W7 to W10 of each of the seventh to tenth fins F7 to F10 may be the same as one another.

Also, in some embodiments, since the width CW1 of the first lower spacer 320 may be the same as the width CW2 of the second lower spacer 420, the width of the fins formed on the first region I may be the same as the width of the fins formed on the second region II. For example, the widths W1 to W3 of each of the first to third fins F1 to F3 may be the same as the width W7 of the seventh fin F7.

Subsequently, referring to FIG. 1, the first field insulating film 110 and the second field insulating film 115 may be formed on the substrate 100. For example, the first field insulating film 110 may be formed on the first region I of the substrate 100 to cover the side surfaces of the first to sixth fins F1 to F6, and the second field insulating film 115 may be formed on the second region II of the substrate 100 to cover the side surfaces of the seventh to thirteenth fins F7 to F13.

Subsequently, a recess process of the upper part of the first field insulating film 110 and the upper part of the second field insulating film 115 is performed, and the upper parts of the first to sixth fins F1 to F6 and the upper parts of the seventh to thirteenth fins F7 to F13 may be exposed. The recess process may include, e.g., a selective etching process. Therefore, the first field insulating film 110 may cover at least some of the side walls of the first to sixth fins F1 to F6. In addition, the second field insulating film 115 may cover at least some of the side walls of the seventh to thirteenth fins F7 to F13.

The method for fabricating the semiconductor device according to some embodiments may provide a semiconductor device with a reduced cell size without being affected by the loading effect. For example, the first fin group FG1 formed on the first region I of the substrate 100 may have a first group pitch GP1 reduced by four times the first fin pitch FP1. Thus, the size of the cell including the first fin group FG1 may be reduced. In addition, since the fins (e.g., the first and second fins F1 and F2) constituting the first fin group FG1 may be fabricated without being affected by the loading effect, an increase in CD (critical dimension; e.g., W1 and W2) due to the loading effect can be prevented. For example, the widths W1 and W2 of the first and second fins F1 and F2 may be the same as the width W7 of the seventh fin F7. As a result, the short channel effect (SCE) of the cell including the first fin group FG1 may be effectively suppressed, and a semiconductor device with improved operation performance may be provided.

Figure 18:
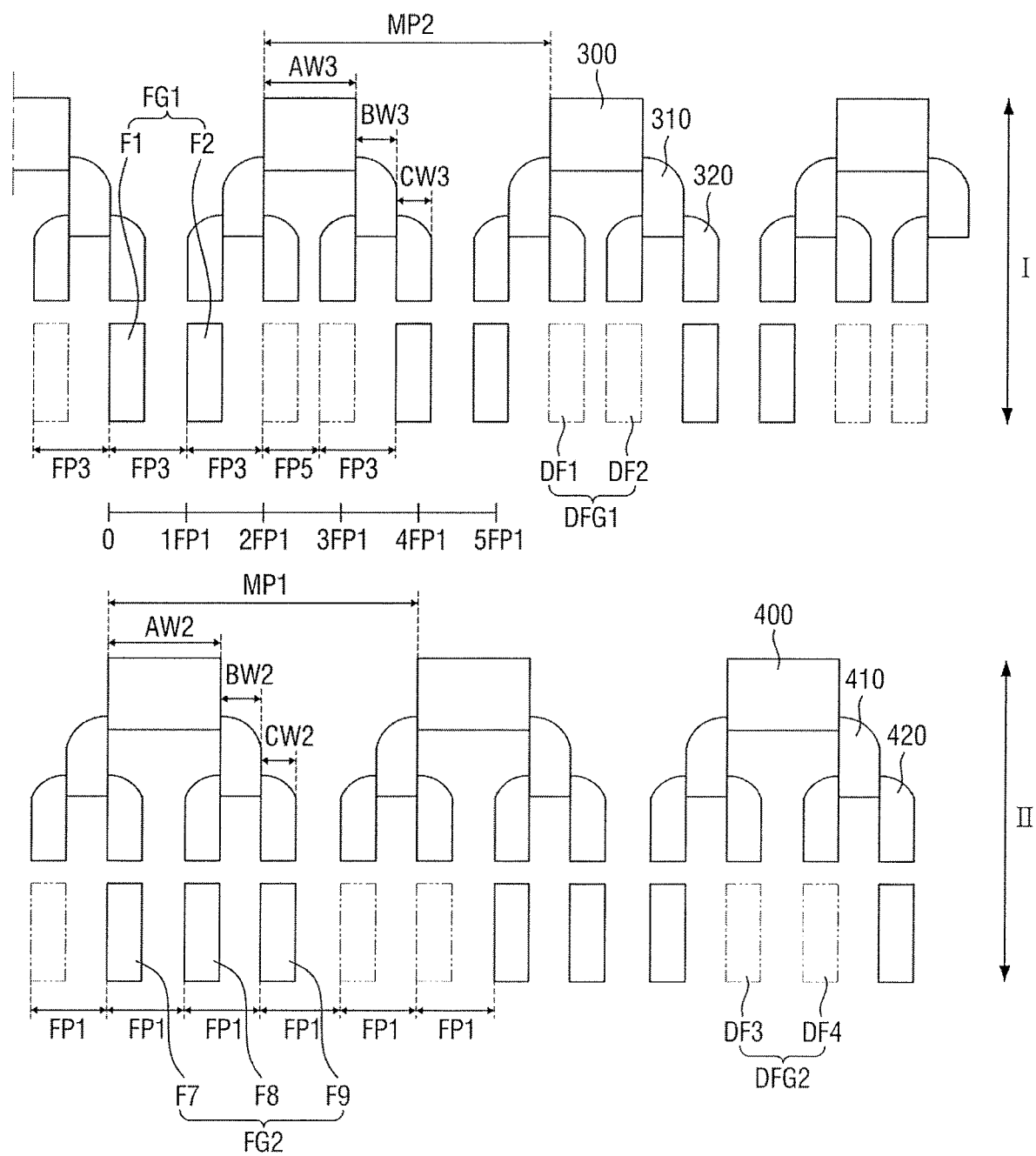
FIG. 18 illustrates a conceptual diagram of a method for fabricating a semiconductor device according to some embodiments.

FIG. 18 is a conceptual diagram illustrating a method for fabricating the semiconductor device according to some embodiments. For convenience of description, parts already described with respect to FIGS. 1 to 17 will be only briefly described or omitted.

Referring to FIG. 18, in the method for fabricating the semiconductor device according to some embodiments, the first fin group FG1 may be formed in a region not overlapping the first mandrel pattern 300, and the first dummy fin group DFG1 may be formed in a region overlapping the first mandrel pattern 300.

In some embodiments, the width AW3 of the first mandrel pitch MP1 may be smaller than the width AW3 of the second mandrel pitch MP2. Accordingly, the first dummy fin DF1 may be disposed at the third fin pitch FP3 from the second fin F2 adjacent to one side thereof, and may be disposed at the fifth fin pitch FP5 smaller than the third fin pitch FP3 from the second dummy fin DF2 adjacent to the other side thereof. In addition, the second dummy fin DF2 may be disposed at the fifth fin pitch FP5 from the first dummy fin DF1 adjacent to one side thereof, and may be disposed at the third fin pitch FP3 from the third fin F3 adjacent to the other side thereof.

However, in some embodiments, the first fin group FG1 may be made up of fins having the same pitch as the fins on both sides adjacent thereto. For example, the first fin F1 may be disposed at the third fin pitch FP3 from both the second dummy fin DF2 and the second fin F2 adjacent thereto. Also, for example, the second fin F2 may be disposed at the third fin pitch FP3 from both the first fin F1 and the first dummy fin DF1 adjacent thereto.

In some embodiments, the third fin pitch FP3 may be the same as the first fin pitch FP1. In some embodiments, the width BW3 of the first upper spacer 310 may be the same as the width BW2 of the second upper spacer 410. In some embodiments, the width CW3 of the first lower spacer 320 may be the same as the width CW2 of the second lower spacer 420.

Figure 19:
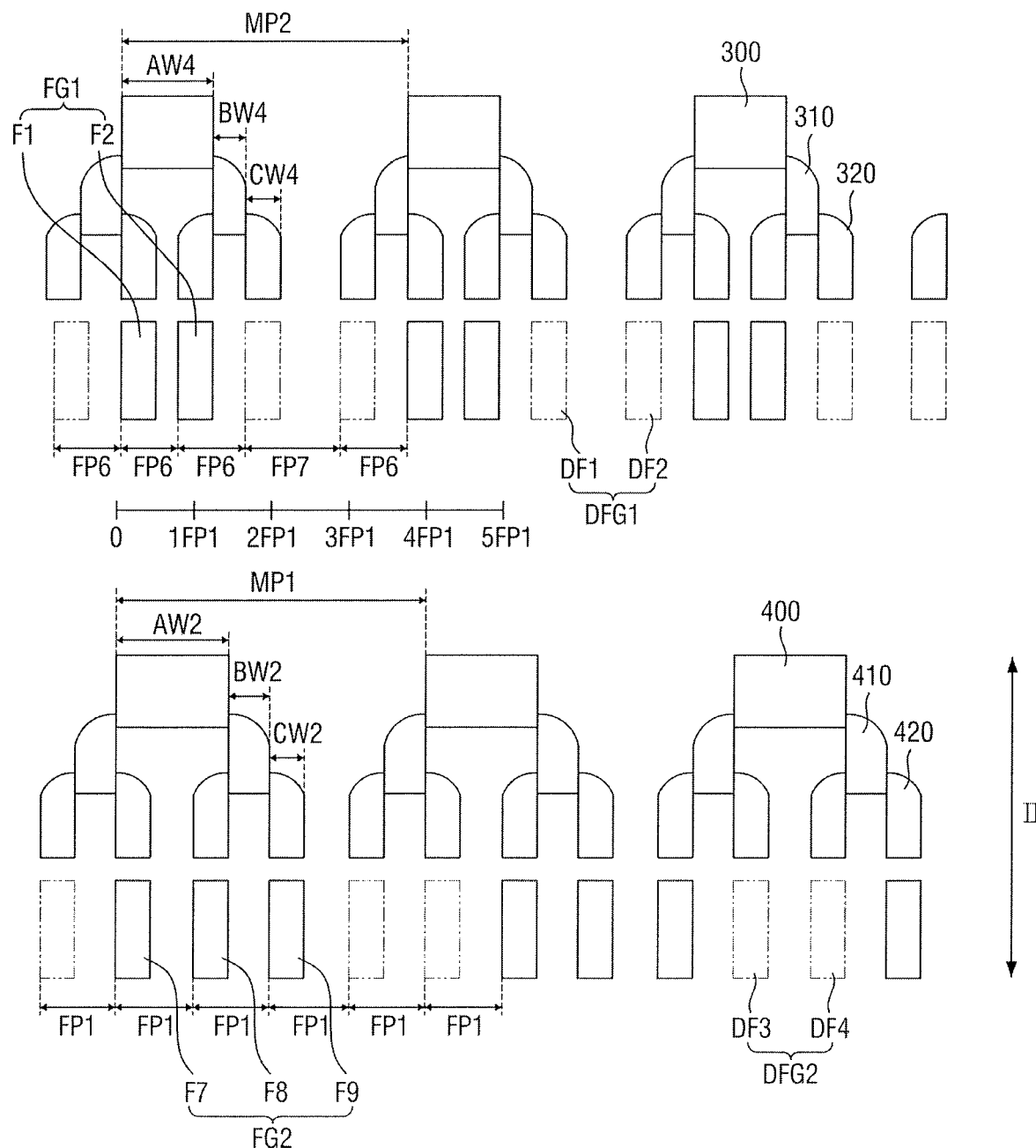
FIG. 19 illustrates a conceptual diagram of a method for fabricating a semiconductor device according to some embodiments.

FIG. 19 is a conceptual diagram illustrating a method for fabricating a semiconductor device according to some embodiments. For convenience of description, parts already described with reference to FIGS. 1 to 17 will be only briefly described or omitted.

Referring to FIG. 19, in the method for fabricating the semiconductor device according to some embodiments, a width AW4 of the first mandrel pitch MP1 may be smaller than a width AW2 of the second mandrel pitch MP2.

In some embodiments, a width BW4 of the first upper spacer 310 may be adjusted appropriately to form the first fin group FG1 and the first dummy fin group DFG1. For example, the width BW4 of the first upper spacer 310 may be smaller than the width BW2 of the second upper spacer 410.

As a result, the first fin group FG1 may be made up of the fins having the same pitch as the fins on both sides adjacent thereto. For example, the first fin F1 may be disposed at the sixth fin pitch FP6 from both the second dummy fin DF2 and the second fin F2 adjacent thereto. Also, for example, the second fin F2 may be disposed at the sixth fin pitch FP6 from both the first fin F1 and the first dummy fin DF1 adjacent thereto.

However, the first dummy fin group DFG1 may be made up of fins having the pitch different from the fins on both sides adjacent thereto. For example, the first dummy fin DF1 may be disposed at the sixth fin pitch FP6 from the second fin F2, and may be disposed at the seventh fin pitch FP7 larger than the sixth fin pitch FP6 from the second dummy fin DF2. Also, for example, the second dummy fin DF2 may be disposed at the seventh fin pitch FP7 from the first dummy fin DF1, and may be disposed at the sixth fin pitch FP6 from the third fin F3.

In some embodiments, the sixth fin pitch FP6 may be smaller than the first fin pitch FP1. Thus, a semiconductor device including the fins with a further reduced fin pitch can be provided. In some embodiments, the width CW4 of the first lower spacer 320 may be the same as the width CW2 of the second lower spacer 420.

Figure 20:
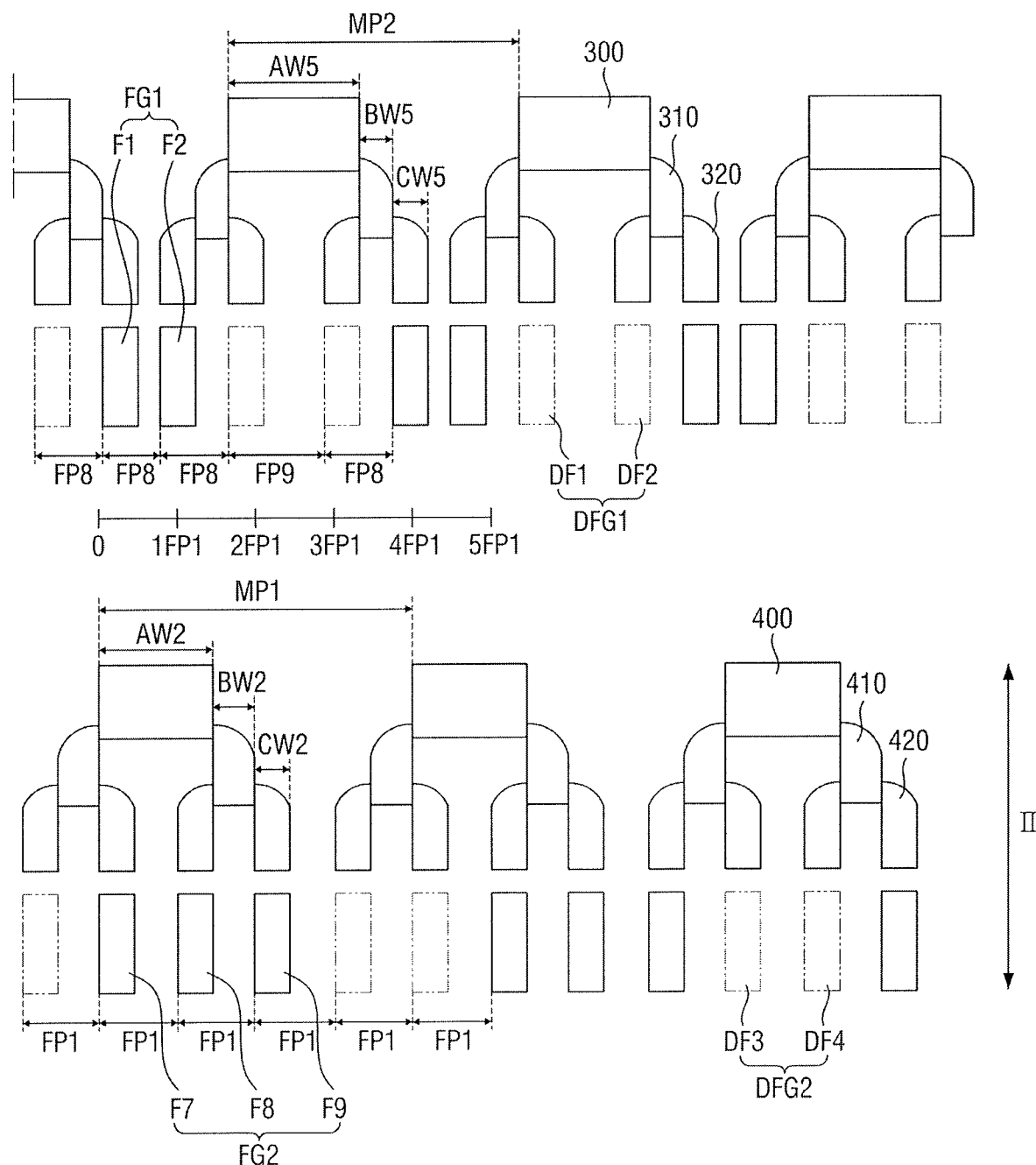
FIG. 20 illustrates a conceptual diagram of a method for fabricating a semiconductor device according to some embodiments.

FIG. 20 is a conceptual diagram illustrating the method for fabricating the semiconductor device according to some embodiments. For convenience of description, parts already described with reference to FIGS. 1 to 18 will be only briefly described or omitted.

Referring to FIG. 20, in the method for fabricating the semiconductor device according to some embodiments, the width AW5 of the first mandrel pitch MP1 may be larger than the width AW2 of the second mandrel pitch MP2.

In some embodiments, the first fin group FG1 may be formed in a region that does not overlap the first mandrel pattern 300, and the first dummy fin group DFG1 may be formed in a region that overlaps the first mandrel pattern 300.

In some embodiments, the width BW5 of the first upper spacer 310 may be adjusted appropriately to form the first fin group FG1 and the first dummy fin group DFG1. For example, the width BW5 of the first upper spacer 310 may be smaller than the width BW2 of the second upper spacer 410.

As a result, the first fin group FG1 may be made up of fins having the same pitch as the fins on both sides adjacent thereto. For example, the first fin F1 may be disposed at the eighth fin pitch FP8 from both the second dummy fin DF2 and the second fin F2 adjacent thereto. Also, for example, the second fin F2 may be disposed at the eighth fin pitch FP8 from both the first fin F1 and the first dummy fin DF1 adjacent thereto.

However, the first dummy fin group DFG1 may be made up of fins having the pitch different from fins on both sides adjacent thereto. For example, the first dummy fin DF1 may be disposed at the eighth fin pitch FP8 from the second fin F2, and may be disposed at the ninth fin pitch FP9 larger than the eighth fin pitch FP8 from the second dummy fin DF2. Also, for example, the second dummy fin DF2 may be disposed at the ninth fin pitch FP9 from the first dummy fin DF1, and may be disposed at the eighth fin pitch FP8 from the third fin F3.

In some embodiments, the eighth fin pitch FP8 may be smaller than the first fin pitch FP1. Thus, a semiconductor device including fins with a further reduced fin pitch can be provided. In some embodiments, the width CW5 of the first lower spacer 320 may be the same as the width CW2 of the second lower spacer 420.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
    forming a plurality of mandrel patterns on a substrate;
    forming an upper spacer on opposite side walls of each of the plurality of mandrel patterns;
    forming a lower spacer on opposite side walls of a pattern onto which the upper spacer is transferred;
    patterning the substrate using the lower spacer to form a first fin group and a first dummy fin group arranged alternately and repeatedly along a first direction; and
    removing the first dummy fin group,
    wherein the first fin group includes first and second fins arranged along the first direction, adjacent to each other and extending in a second direction intersecting the first direction, respectively,
    wherein the first dummy fin group includes first and second dummy fins arranged along the first direction, adjacent to each other and extending in the second direction, respectively,
    wherein the first and second fins in a same first fin group are disposed at a first fin pitch,
    wherein the second fin in the first fin group and the first dummy fin in the first dummy fin group are disposed at the first fin pitch,
    wherein the first and second dummy fins in a same first dummy fin group are disposed at a second fin pitch different from the first fin pitch, and wherein the second dummy fin in the first dummy fin group and the first fin in an adjacent additional first fin group are disposed at the first fin pitch.

2. The method as claimed in claim 1, wherein the first fin pitch is greater than the second fin pitch.

3. The method as claimed in claim 1, wherein the first fin pitch is smaller than the second fin pitch.

4. The method as claimed in claim 1, wherein forming the first fin group and the first dummy fin group includes:
sequentially forming a hard mask film and a sacrificial film on the substrate, before forming the plurality of mandrel patterns;
patterning the sacrificial film using the upper spacer as an etching mask to form a sacrificial pattern;
forming the lower spacer on opposite side walls of the sacrificial pattern;
patterning the hard mask film using the lower spacer as an etching mask to form a hard mask pattern; and
patterning the substrate using the hard mask pattern as an etching mask.

5. The method as claimed in claim 4, wherein the hard mask film includes at least one of a silicon-containing material, a carbon-containing material, and metals.

6. The method as claimed in claim 4, wherein the hard mask film includes a lower layer including a silicon nitride, an intermediate layer including silicon oxide, and an upper layer including polycrystalline silicon.

7. The method as claimed in claim 4, wherein the sacrificial film includes at least one of polycrystalline silicon, an amorphous carbon layer, and a spin-on hardmask.

8. The method as claimed in claim 1, wherein:
the substrate includes a first region and a second region,
the first fin group and the first dummy fin group are formed on the first region of the substrate,
the method further includes:
patterning the second region of the substrate using the lower spacer to form a third fin, a fourth fin, and a fifth fin sequentially arranged along a third direction and each extending in a fourth direction intersecting the third direction;
the third and fourth fins and the fourth and fifth fins are disposed at a third fin pitch, respectively, and
the first fin pitch is equal to or smaller than the third fin pitch.

9. The method for as claimed in claim 8, wherein each of the plurality of mandrel patterns is disposed at a pitch smaller than four times the third fin pitch.

10. The method for as claimed in claim 9, wherein the pitch at which each of the plurality of mandrel patterns is disposed is greater than three times the third fin pitch.

11. A method for fabricating a semiconductor device, the method comprising:
providing a substrate including a first region and a second region;
forming a plurality of first mandrel patterns at a first mandrel pitch on the first region of the substrate;
forming a plurality of second mandrel patterns at a second mandrel pitch on the second region of the substrate, the first mandrel pitch being smaller than the second mandrel pitch; and
performing a self-aligned quadruple patterning (SAQP) process using the plurality of first mandrel patterns and the plurality of second mandrel patterns to form a plurality of first fin groups on the first region and form a plurality of second fin groups on the second region,
wherein each of the plurality of first fin groups includes first and second fins adjacent to each other and extending side by side,
wherein each of the plurality of second fin groups includes third to fifth fins adjacent to each other and extending side by side,
wherein the third to fifth fins are disposed at a first fin pitch, respectively, and
wherein the second mandrel pitch is four times the first fin pitch.

12. The method as claimed in claim 11, wherein the first mandrel pitch is greater than three times the first fin pitch and smaller than four times the first fin pitch.

13. The method as claimed in claim 11, wherein the first and second fins are disposed at a second fin pitch equal to the first fin pitch.

14. The method as claimed in claim 11, wherein the first and second fins are disposed at a second fin pitch smaller than the first fin pitch.

15. The method as claimed in claim 11, wherein a width of each of the plurality of first mandrel patterns is the same as a width of each of the plurality of second mandrel patterns.

16. The method as claimed in claim 11, wherein performing the SAQP process includes:
forming a first upper spacer on both side walls of each of the plurality of first mandrel patterns, and forming a second upper spacer on both side walls of each of the plurality of second mandrel patterns;
forming a first lower spacer on both side walls of the first upper spacer, and forming a second lower spacer on both side walls of the second upper spacer; and
patterning the substrate using the first lower spacer and the second lower spacer.

17. The method as claimed in claim 16, wherein performing the SAQP process further includes:
sequentially forming a hard mask film and a sacrificial film on the substrate, before forming the plurality of first mandrel patterns and the plurality of second mandrel patterns;
patterning the sacrificial film using the first upper spacer and the second upper spacer as an etching mask to form a sacrificial pattern;
forming the first lower spacer and the second lower spacer on opposite side walls of the sacrificial pattern;
patterning the hard mask film using the first lower spacer and the second lower spacer as an etching mask to form a hard mask pattern; and
patterning the substrate using the hard mask pattern as an etching mask.

18. The method as claimed in claim 17, wherein the hard mask film includes a lower layer including a silicon nitride, an intermediate layer including silicon oxide, and an upper layer including polycrystalline silicon.

19. The method as claimed in claim 16, wherein a width of the first upper spacer is the same as a width of the second upper spacer, and a width of the first lower spacer is the same as a width of the second lower spacer.

20. The method as claimed in claim 16, wherein a width of the first upper spacer is smaller than a width of the second upper spacer, and a width of the first lower spacer is the same as a width of the second lower spacer.

* * * * *